United States Patent
Joo

(10) Patent No.: US 7,105,418 B2
(45) Date of Patent: Sep. 12, 2006

(54) MULTIPLE STACKED CAPACITORS FORMED WITHIN AN OPENING WITH THICK CAPACITOR DIELECTRIC

(75) Inventor: Heung-Jin Joo, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/997,408

(22) Filed: Nov. 24, 2004

(65) Prior Publication Data

US 2005/0170599 A1   Aug. 4, 2005

(30) Foreign Application Priority Data

Feb. 4, 2004   (KR) ............... 10-2004-0007305

(51) Int. Cl.
*H01L 21/20* (2006.01)
(52) U.S. Cl. ............... 438/396; 438/239; 438/253; 438/397
(58) Field of Classification Search ............... 438/3, 438/240, 241, 253, 254, 396, 597, 398, 387, 438/386, 388, 399, 239, 243, 244, 245, 255, 438/256, 397
See application file for complete search history.

(56) References Cited

U.S. PATENT DOCUMENTS

| | | | | |
|---|---|---|---|---|
| 4,708,766 A | * | 11/1987 | Hynecek | 438/722 |
| 5,023,683 A | * | 6/1991 | Yamada | 257/309 |
| 5,185,284 A | * | 2/1993 | Motonami | 438/244 |
| 5,851,876 A | * | 12/1998 | Jenq | 438/253 |
| 5,976,928 A | | 11/1999 | Kirlin et al. | 438/240 |
| 6,215,142 B1 | * | 4/2001 | Lee et al. | 257/301 |
| 6,238,961 B1 | * | 5/2001 | Asano et al. | 438/197 |
| 6,458,284 B1 | * | 10/2002 | Kashihara | 216/47 |
| 6,486,531 B1 | * | 11/2002 | Oh | 257/532 |
| 6,559,497 B1 | | 5/2003 | Shih et al. | 257/306 |
| 6,642,566 B1 | * | 11/2003 | Divakaruni et al. | 257/302 |
| 6,815,761 B1 | * | 11/2004 | Nishimoto et al. | 257/316 |
| 2002/0058376 A1 | * | 5/2002 | Han | 438/240 |
| 2003/0075753 A1 | * | 4/2003 | Chu et al. | 257/308 |
| 2004/0119170 A1 | * | 6/2004 | Kim et al. | 257/775 |
| 2004/0191929 A1 | * | 9/2004 | Lee | 438/3 |
| 2005/0118734 A1 | * | 6/2005 | Mikawa | 438/3 |

OTHER PUBLICATIONS

Korean Patent Application No. 1020010081684 to Masatoshi et al, having Publication date of Jul. 4, 2002 (w/English Abstract page).
Korean Patent Application No. 1020020006745 to Toshiyuki, having Publication date of Aug. 13, 2002 (w/English Abstract page).

* cited by examiner

*Primary Examiner*—Asok K. Sarkar
*Assistant Examiner*—Victor V. Yevsikov
(74) *Attorney, Agent, or Firm*—Monica M. Choi

(57) ABSTRACT

For forming stacked capacitors, an opening is formed through at least one semiconductor material. A lower electrode material is patterned within the opening to form a plurality of lower electrodes within the opening. The stacked capacitors are formed with the lower electrodes within the opening by depositing a capacitor dielectric and an upper electrode within the opening. With such a relatively large opening, a capacitor dielectric of the stacked capacitors is deposited with a large thickness for improving reliability of the stacked capacitors.

37 Claims, 21 Drawing Sheets

(PIROR ART)

MULTIPLE STACKED CAPACITORS FORMED WITHIN AN OPENING WITH THICK CAPACITOR DIELECTRIC

This patent application claims priority under 35 U.S.C. § 119 to Korean Patent Application No. 2004-0007305 filed on Feb. 4, 2004, the entire contents of which are incorporated herein by reference.

BACKGROUND OF THE INVENTION

1. Field of the Invention

The present invention relates generally to stacked capacitors, and more particularly to forming multiple stacked capacitors within a relatively large opening with thick capacitor dielectric.

2. Description of the Related Art

Capacitors are widely used for storing data by charge retention, as known to one of ordinary skill in the art. For example, a DRAM (dynamic random access memory) cell and a ferroelectric memory cell each use a capacitor for such data storage.

Integrated circuits are desired to be fabricated ever more densely. On the other hand, the capacitance of an integrated circuit capacitor decreases with size reduction of the capacitor. Such lower capacitance degrades the sensing margin during read of data stored in a memory cell.

Thus, the capacitance of the capacitor is desired to be increased for smaller area of the capacitor. To that end, the dielectric constant of the capacitor dielectric between two electrodes is increased for in turn increasing the capacitance. Alternatively, a stacked capacitor is formed with increased overlap between two electrodes formed with increased height for increased capacitance.

One example of such a stacked capacitor is disclosed in U.S. Pat. No. 6,559,497 as illustrated in the cross-sectional view of FIG. 1. Referring to FIG. 1, a first oxide layer 11 is formed on a semiconductor substrate 10. A conductive plug 12 is formed through the first oxide layer 11 to contact a predetermined region of the semiconductor substrate 10.

In addition, a second oxide layer 13 is formed to cover the first oxide layer 11 and the conductive plug 12. A hole 14 is formed through the second oxide layer 13 to expose the conductive plug 12. A conformal lower electrode 15 is disposed on inner sidewalls and a bottom surface of the hole 14. A conformal capacitor dielectric 16 covers the lower electrode 15. An upper electrode 17 is disposed on the capacitor dielectric and fills the hole 14. The upper and lower electrodes 15 and 17 and the capacitor dielectric 16 form the stacked capacitor.

In the prior art stacked capacitor of FIG. 1, the lower electrode 15 is conformally deposited onto the inner sidewall(s) and the bottom wall of the hole 14 for increasing the area of overlap between the electrodes 15 and 17. In addition, the capacitor dielectric 16 is a high-k dielectric (i.e., a dielectric having a dielectric constant higher than that of silicon dioxide $SiO_2$). Such increased area of overlap and such a high-k capacitor dielectric 16 increase the capacitance of the stacked capacitor.

However, as integrated circuits are fabricated more densely, the aspect ratio of the hole 14 is increased. For ensuring that the upper electrode 17 properly fills the hole 14 without a void, the lower electrode 15 and the capacitor dielectric 16 are formed to be as thin as possible. For example, the total thickness of the lower electrode 15 and the capacitor dielectric 16 is smaller than half of the width of the hole 14 for ensuring that the upper electrode 17 properly fills the hole 14.

With such a thin capacitor dielectric 16, leakage current between the electrodes 15 and 17 may increase, for degradation of data stored in the capacitor. On the other hand, with a thicker capacitor dielectric 16, the upper electrode 17 may not properly fill the hole 14 with void formation leading to decreased overlap and in turn decreased capacitance between the two electrodes 15 and 17.

In addition, the capacitor dielectric 16 may be comprised of a ferroelectric material as disclosed in U.S. Pat. No. 6,559,497. As known to one of ordinary skill in the art, a ferroelectric material is polarized to a predetermined direction according to the intensity and direction of an external electric field. Furthermore, a hysteresis phenomenon maintains the polarized state of the ferroelectric material even after the external electric field is removed. Thus, a ferroelectric memory device with the ferroelectric material has a nonvolatile characteristic from the polarization hysteresis for maintaining stored data even when power is cut off.

However, if the thickness of the capacitor dielectric 16 comprised of a ferroelectric material is reduced, the polarization hysteresis of the capacitor dielectric 16 may be deteriorated. For example, if the thickness of the capacitor dielectric 16 is less than about 500Å, the capacitor dielectric 16 may not maintain the polarization hysteresis. In that case, a ferroelectric memory device formed with the stacked capacitor loses the nonvolatile characteristic.

Nevertheless, the width of the hole 14 and thus the thickness of the capacitor dielectric 16 of the prior art stacked capacitor of FIG. 1 is desired to be further decreased for higher integrated circuit density. Such decreased thickness of the capacitor dielectric 16 deteriorates reliability of the semiconductor device formed with the stacked capacitor of FIG. 1.

Thus, a mechanism is desired for forming stacked capacitors with a larger thickness of the capacitor dielectric even in densely fabricated integrated circuits.

SUMMARY OF THE INVENTION

Accordingly, a plurality of stacked capacitors is formed within a relatively large opening of an integrated circuit. With such a relatively large opening, the capacitor dielectric is deposited with a large thickness for improving reliability of the stacked capacitors.

In a general aspect of the present invention, for forming a plurality of stacked capacitors, an opening is formed through at least one semiconductor material. A lower electrode material is patterned within the opening to form a plurality of lower electrodes within the opening. The stacked capacitors are formed with the lower electrodes within the opening.

In one embodiment of the present invention, the opening is formed through a capping layer and a molding layer that are each comprised of an insulating material deposited over a semiconductor substrate.

In another embodiment of the present invention, each of the lower electrodes includes a respective support part disposed over a respective conductive plug, and includes a wall part disposed along a respective portion of at least one wall of the opening. In a further embodiment of the present invention, at least one sidewall of the opening is formed to be inclined.

For patterning the lower electrodes in another embodiment of the present invention, the lower electrode material is conformally deposited on at least one wall of the opening. The lower electrode material is patterned in a photolithography process for forming the lower electrodes.

In an example embodiment of the present invention, the photolithography process includes an isotropic (non-directional) etch when the lower electrodes are formed on at least one non-inclined sidewall of the opening. In an alternative embodiment of the present invention, the photolithography process includes an anisotropic (directional) etch when the lower electrodes are formed on at least one inclined sidewall of the opening.

In another embodiment of the present invention for forming the stacked capacitors, a capacitor dielectric is deposited on the lower electrodes, and an upper electrode is formed on the capacitor dielectric. In an example embodiment of the present invention, the capacitor dielectric is comprised of one of a high-K dielectric or a ferroelectric material.

In a further embodiment of the present invention, the upper electrode is continuous over a plurality of openings, with each opening having a respective plurality of stacked capacitors formed therein. In an alternative embodiment of the present invention, the upper electrode is continuous over a column of stacked capacitors formed through a plurality of openings.

In another embodiment of the present invention, an upper insulating layer is deposited over the upper electrode. An interconnect plug is formed through the upper insulating layer within the opening to be coupled to the upper electrode. In an alternative embodiment of the present invention, the interconnect plug is formed through the upper insulating layer outside of the opening over a mold layer to be coupled to the upper electrode.

In a further embodiment of the present invention, when the opening is formed through the capping layer and the molding layer, the lower electrodes, the capacitor dielectric, and the upper electrode are planarized down to the capping layer to be contained within the opening. In an alternative embodiment of the present invention, the lower electrodes, the capacitor dielectric, and the upper electrode are formed over a portion of the capping layer.

In another embodiment of the present invention, the opening is filled with an upper insulating layer or with the upper electrode.

In an example embodiment of the present invention, the opening has a square shape, and each lower electrode is formed at a respective corner of the opening. In another example embodiment of the present invention, the opening has a groove shape, and the lower electrodes are formed along sides of the opening.

In this manner, the stacked capacitors are formed within a relatively large opening with a low aspect ratio such that the capacitor dielectric may be deposited with a higher thickness. Such a higher thickness of the capacitor dielectric results in higher reliability of the stacked capacitors.

BRIEF DESCRIPTION OF THE DRAWINGS

The above and other aspects and advantages of the present invention will become more apparent when described in detailed exemplary embodiments thereof with reference to the attached drawings in which:

FIGS. 9A through 12A are top views illustrating steps for fabricating the stacked capacitors of FIG. 2, according to an embodiment of the present invention;

FIGS. 9B through 12B are cross-sectional views along line III–III' of FIGS. 9A through 12A, respectively;

FIGS. 13A through 15A are top views illustrating steps for fabricating the stacked capacitors of FIG. 8, according to an embodiment of the present invention;

FIGS. 13B through 15B are cross-sectional views along line IV–IV' in FIGS. 13A through 15A, respectively;

The figures referred to herein are drawn for clarity of illustration and are not necessarily drawn to scale. Elements having the same last two digits of reference numbers in FIGS. 1, 2, 3, 4, 5, 6, 7, 8, 9A, 9B, 10A, 10B, 11A, 11B, 12A, 12B, 13A, 13B, 14A, 14B, 15A, 15B, 16, 17, 18, 19, 20, 21A, 21B, 22A, 22B, 23A, and 23B refer to elements having similar structure and/or function.

DETAILED DESCRIPTION OF THE INVENTION

Figure 1:
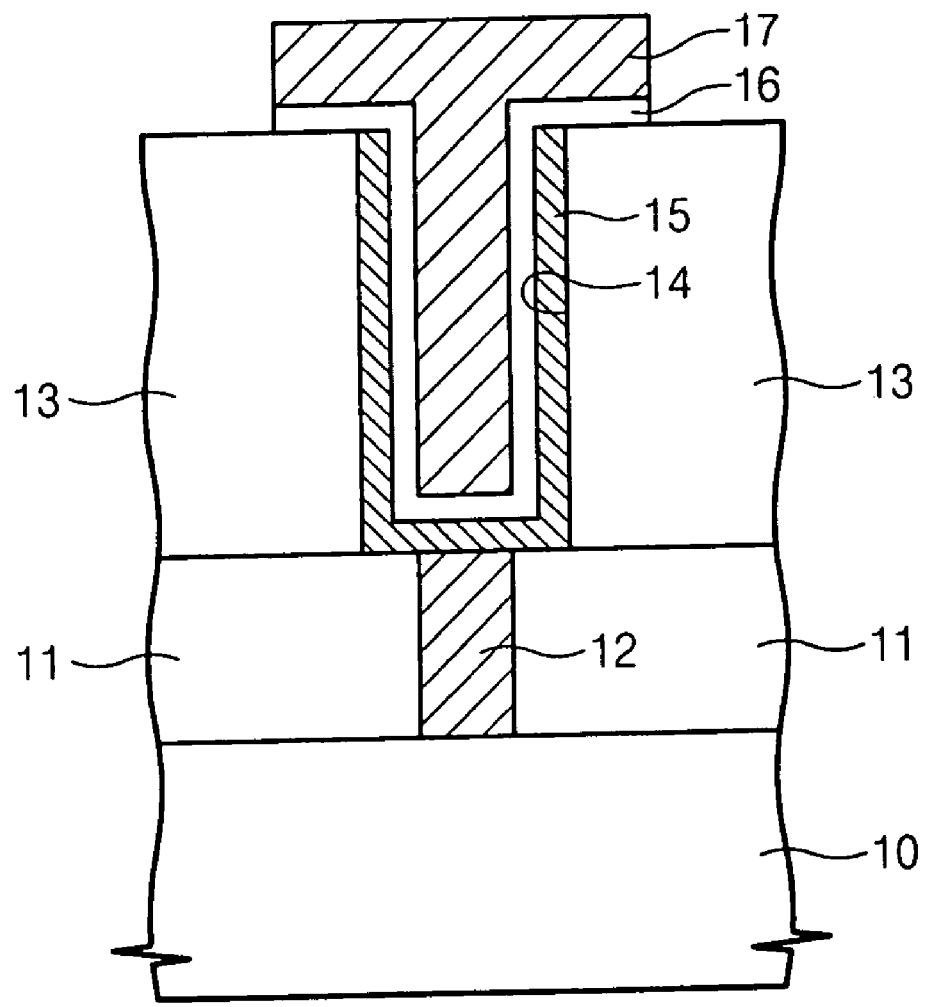
FIG. 1 is a cross-sectional view of a stacked capacitor of the prior art.
Figure 2:
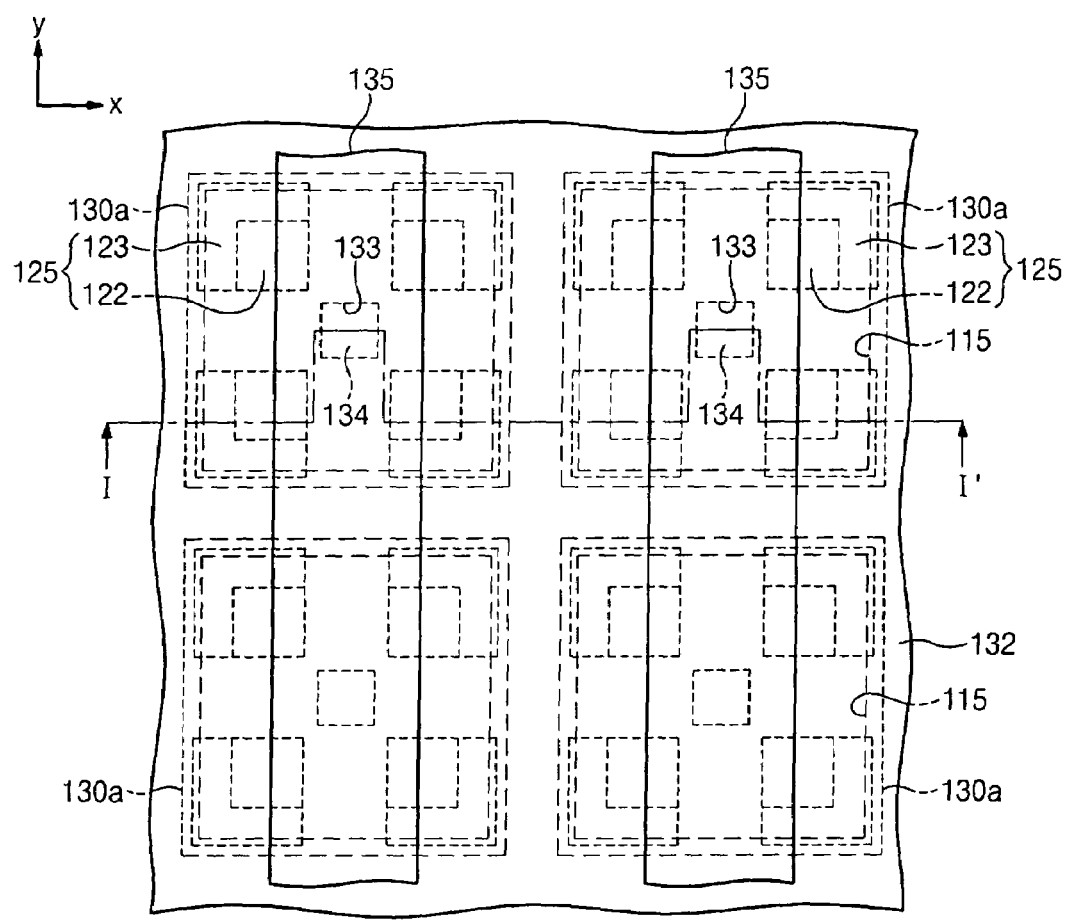
FIG. 2 is a top view of stacked capacitors formed within a relatively large opening, according to an embodiment of the present invention.
Figure 3:
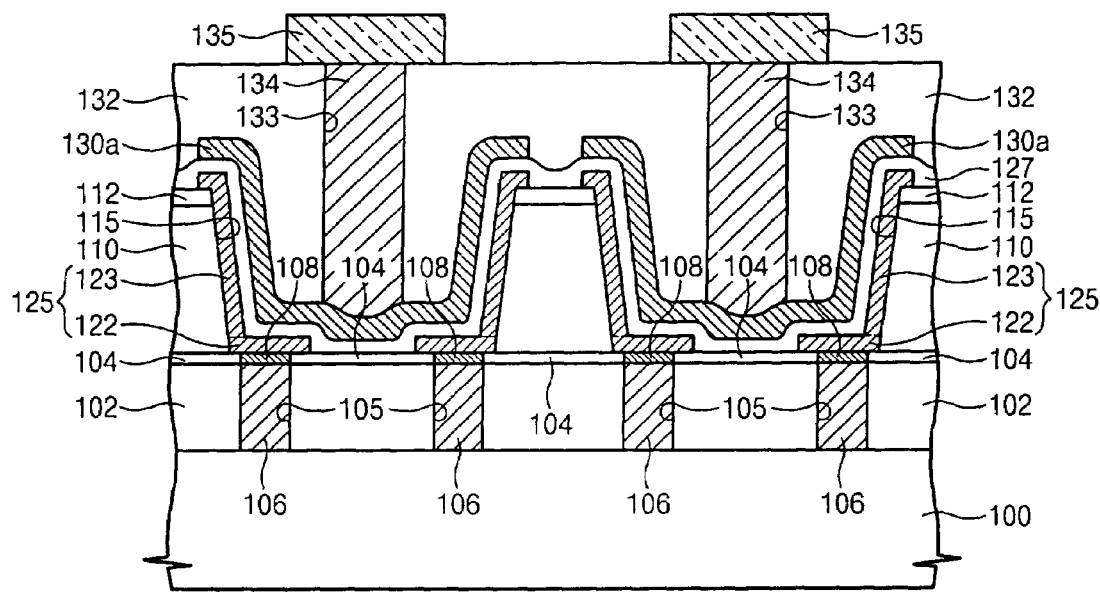
FIG. 3 is a cross-sectional view along line I–I' in FIG. 2.

FIG. 2 is a top view of stacked capacitors formed according to an embodiment of the present invention. FIG. 3 is a cross-sectional view along line I–I' in FIG. 2. FIG. 3 is an isometric view of lower electrodes of the stacked capacitors of FIG. 2.

Figure 4:
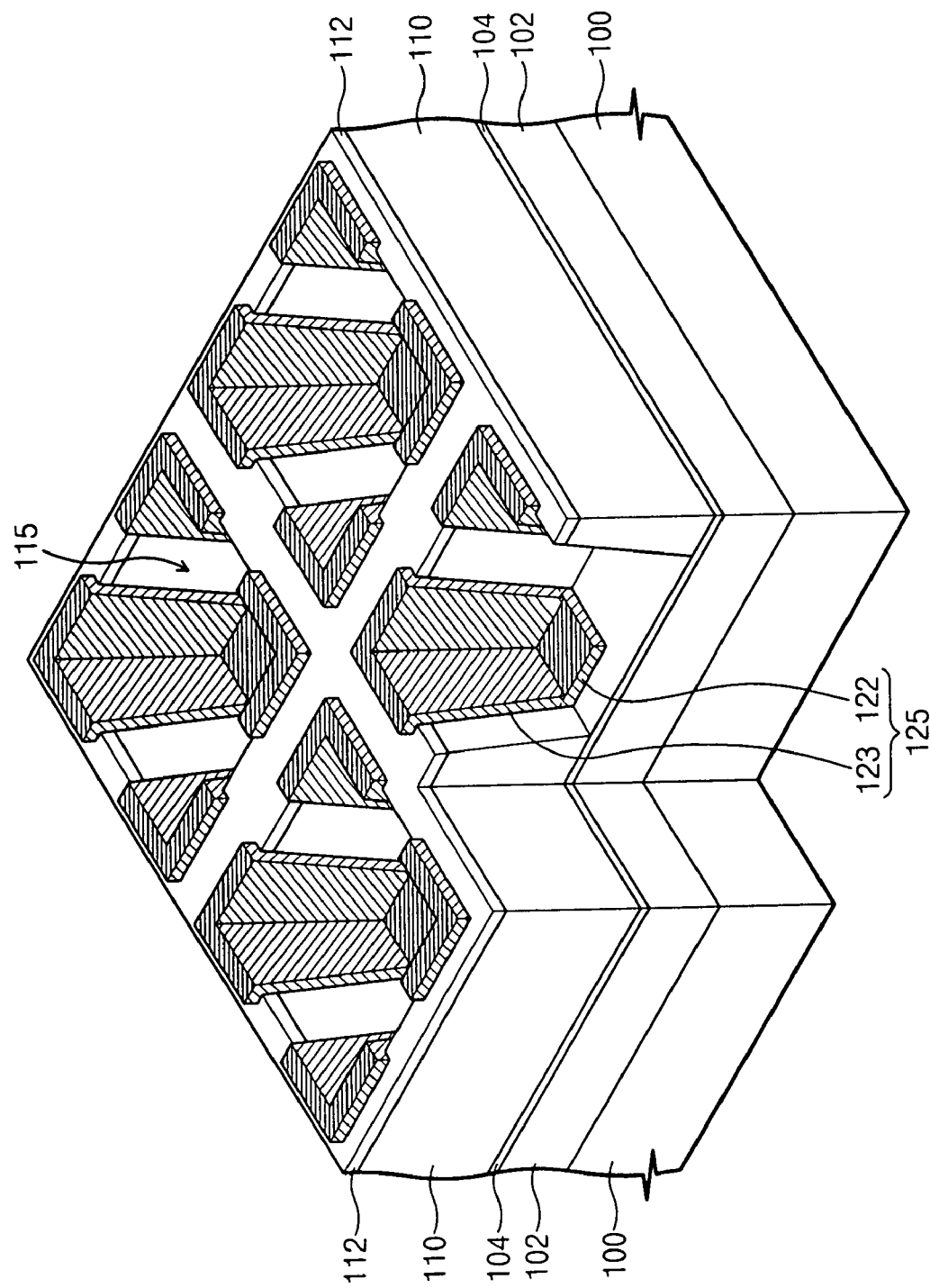
FIG. 4 is an isometric view of lower electrodes of the stacked capacitors of FIG. 2.

Referring to FIGS. 2, 3, and 4, a lower insulating layer 102 and an etch stop layer 104 are deposited sequentially on a semiconductor substrate 100. Contact holes 105 are etched through the etch stop layer 104 and the lower insulating layer 102 to expose regions of the substrate 100. The contact holes 105 are disposed along rows and columns over the substrate 100.

In addition, a respective contact plug 106 and a respective oxygen barrier pattern 108 fill each contact hole 105. The present invention may also be practiced with the oxygen barrier pattern 108 omitted. A respective source/drain of a field effect transistor (not shown) may be in the substrate 100 under each contact plug 106 for forming a respective DRAM (dynamic random access memory) cell in one example embodiment of the present invention.

The lower insulating layer 102 is comprised of silicon dioxide ($SiO_2$), and the contact plugs 106 are comprised of doped polysilicon or other conductive material such as a metal, in one embodiment of the present invention. For example, the contact plugs 105 are comprised of tungsten, or a metal nitride such as titanium nitride or tantalum nitride, or a metal silicide such as tungsten silicide, in an example embodiment of the present invention.

The oxygen barrier pattern 108 is comprised of a conductive material that prevents oxygen from reaching the conductive plug 105. For example, the oxygen barrier pattern 108 is comprised of a metal nitride such as titanium nitride or tantalum nitride, or a conductive metal oxide such as iridium oxide, in an example embodiment of the present invention.

A mold layer 110 covers the etch stop layer 104 and the oxygen barrier patterns 108. A capping layer 112 is disposed on the mold layer 110. The mold layer 110 is comprised of silicon dioxide ($SiO_2$), in one embodiment of the present invention. The etch stop layer 104 is comprised of an insulating material having etch selectivity from the mold layer 110.

A plurality of storage openings 115 are formed through the capping layer 112 and the mold layer 110. The storage openings 115 are formed along rows and columns, in one embodiment of the present invention.

Each storage opening 115 exposes a plurality of neighboring oxygen barrier patterns 108. In FIG. 2 for example, each storage opening 115 exposes an array of four neighboring oxygen barrier patterns 108 disposed along two rows and two columns. Further in FIG. 2, each storage opening 115 has a square shape with four inner corners, with each corner disposed outside a respective one of the four exposed oxygen barrier patterns 108.

A respective lower electrode 125 is disposed on each of the four oxygen barrier patterns 108 within the opening 115. Each lower electrode 125 includes a respective support part 122 and a respective wall part 123. The respective support part 122 contacts a top surface of an oxygen barrier pattern 108, and the respective wall part 123 extends upward along sidewalls of a respective corner of the opening 115. In the embodiment of FIGS. 2 and 4, the four lower electrodes 125 are symmetrically formed at the four corners with respect to a center part of the square opening 115.

A top portion of the wall part 123 extends laterally over a top surface of the capping layer 112 in the embodiment of FIGS. 3 and 4. Further in the embodiment of FIGS. 2, 3, and 4, the lower electrodes 125 are separated and electrically insulated from each-other.

The lower electrodes 125 are comprised of a noble metal such as iridium (Ir), ruthenium (Ru), or platinum (Pt), in an example embodiment of the present invention. In addition, the lower electrodes 125 may further include an adhesion layer and/or a barrier layer. For example, an adhesion layer comprised of titanium or tantalum may be included in a stack of layers forming the lower electrodes 124. In addition, a barrier layer comprised of a metal nitride such as titanium nitride, tantalum nitride, aluminum silicon nitride, or tungsten nitride, may be included in the stack of layers forming the lower electrodes 125.

The adhesion layer would be formed for enhancing adhesion of the noble metal of the lower electrodes 125 to underlying material. The barrier layer would prevent oxygen from reaching an interface between the lower electrode 125 and the buried contact plug 106. In that case, the oxygen barrier pattern 108 may be omitted.

Further referring to FIGS. 2 and 3, a capacitor dielectric 127 is conformally deposited with relatively high thickness over the lower electrodes 125. The capacitor dielectric 127 is comprised of a high-k dielectric having a dielectric constant larger than that of silicon dioxide ($SiO_2$), in one embodiment of the present invention. For example, the capacitor dielectric 127 is comprised of aluminum oxide, hafnium oxide, titanium oxide, or a combination thereof.

Alternatively, the capacitor dielectric 127 is comprised of a ferroelectric material such as $SrTiO_3$, $BaTiO_3$, BST, PZT, SBT($SrBi_2Ta_2O_9$), PLZT($(Pb,La)(Zr,Ti)O_3$), $((Pb,Ca)(Zr,Ti))O_3$), $Bi_4Ti_3O_{12}$, BLT($BiLaTiO_3$), or a combination thereof. When the capacitor dielectric 127 is formed of PZT, the etch stop layer 104 and the capping layer 112 are comprised of an insulating material such as $TiO_2$ that stimulates growth of PZT crystal. $TiO_2$ not only has etch selectivity with respect to silicon dioxide but also stimulates the growth of PZT. If the capacitor dielectric 127 is comprised of the above material except PZT, the etch stop layer 104 may be comprised of silicon nitride, and the capping layer 112 may be comprised of silicon nitride or not be formed.

Further referring to FIGS. 2 and 3, an upper electrode 130a is disposed on the capacitor dielectric 127 and over the lower electrodes 125. The upper electrode 130a is disposed over both of the wall part 123 and the support part 122 of the lower electrodes 125. In the embodiment of FIG. 2, each upper electrode 130a is disposed over the respective four lower electrodes 125 within a respective opening 115. Alternatively, each upper electrode 130a is disposed over all the lower electrodes 125 in a cell block (not shown) of the substrate 100.

In any case, the upper electrodes 130a are separate and electrically isolated from each other. The upper electrodes 130a are arranged along rows and columns in an embodiment of the present invention. Referring to FIG. 3, a top portion of the upper electrode 130a protrudes laterally to overlap the capping layer 112. The upper electrode 130a is comprised of a noble metal such as iridium (Ir), ruthenium (Ru) or platinum (Pt) or the like. The upper electrode 130a is conformal on top of underlying structures in an embodiment of the present invention.

Each stacked capacitor in FIGS. 2, 3, and 4 is comprised of a respective lower electrode 125, a respective capacitor dielectric 127, and a respective upper electrode 130a. In the embodiment of FIG. 2, four stacked capacitors are formed with the four lower electrodes 125 within each storage opening 115. Each storage opening 115 has an integral capacitor dielectric 127 and an integral upper electrode 130a formed therein for forming the four stacked capacitors in the embodiment of FIGS. 2, 3, and 4.

An upper insulating layer 132 is blanket deposited to cover the upper electrodes 130a. When the upper electrodes 130a are conformal, the upper insulating layer 132 fills the storage opening 115. In an example embodiment of the present invention, the upper insulating layer 132 includes an encapsulating layer (not illustrated) covering the upper electrodes 130a. The encapsulating layer prevents degradation of the upper electrodes 130a and the capacitor dielectric 127 and is comprised of $Al_2O_3$, $TiO_2$, or a combination thereof for example.

Interconnection contact holes 133 are formed through the upper insulating layer 132 to expose regions such as centers of the upper electrodes 130a. A respective interconnection plug 134 fills each of the interconnection contact holes 133 to contact a respective upper electrode 130a. Interconnections 135 are disposed on the upper insulating layer 132 to couple the interconnection plugs 134 along a column. Each interconnection 135 corresponds to a plate line when the stacked capacitors are used within a ferroelectric memory device.

Alternatively, an upper electrode 130a may be formed continuously over a column of stacked capacitors through a column of storage openings 115. In that case, each upper electrode 130a corresponds to a plate line of a ferroelectric memory device, and the interconnection plugs 134 and the interconnections 135 may be omitted.

Figure 5:
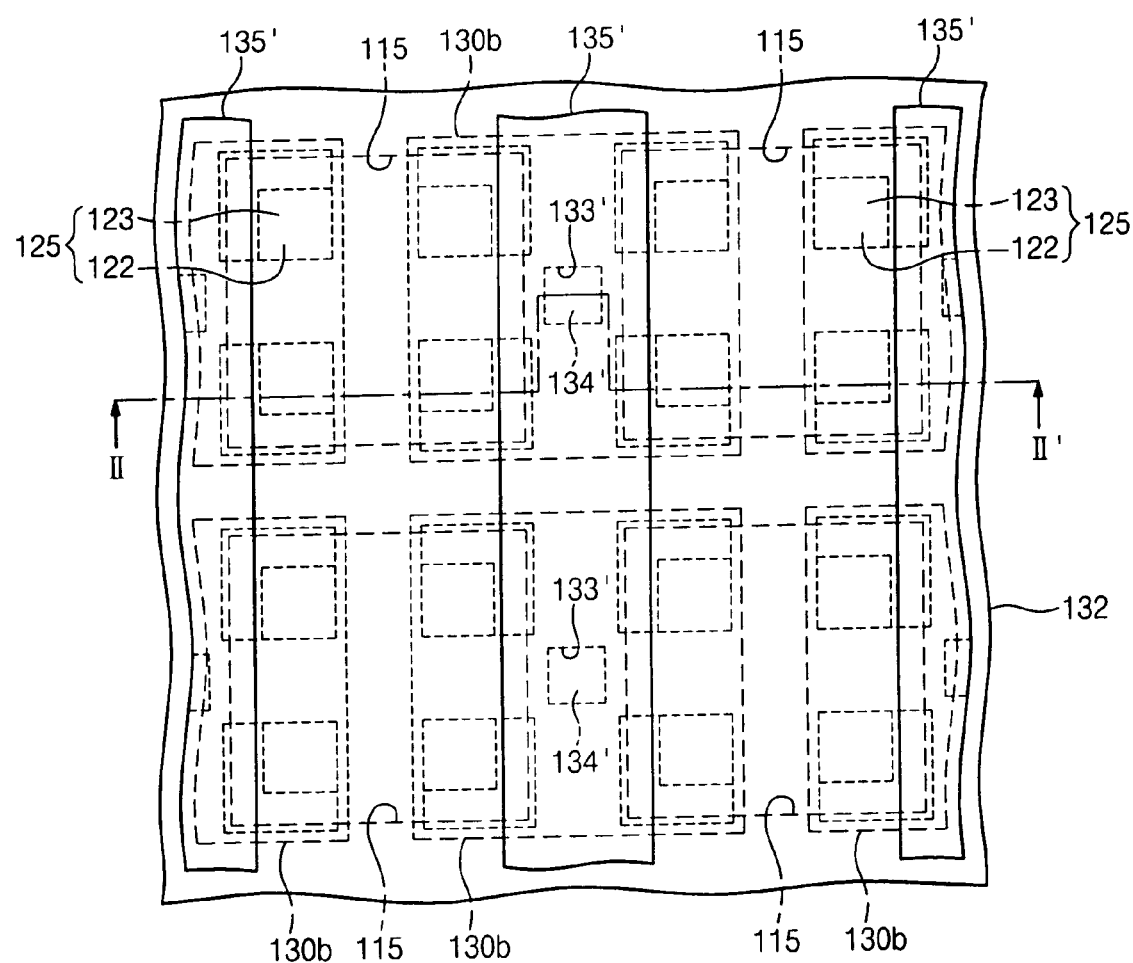
FIG. 5 is a top view of stacked capacitors with change of location of upper electrodes of the stacked capacitors, according to another embodiment of the present invention.
Figure 6:
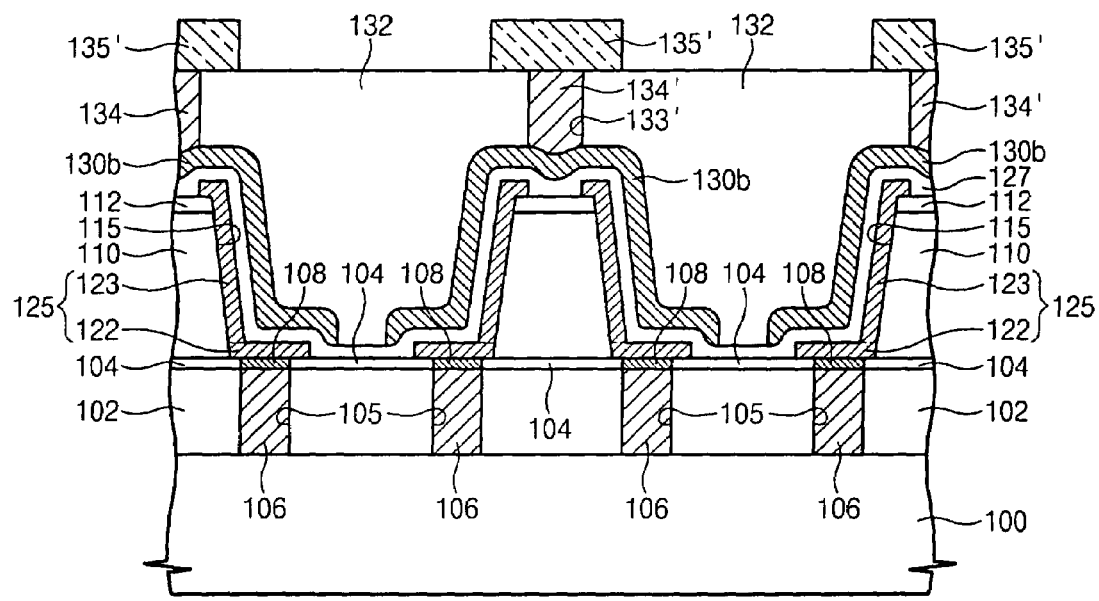
FIG. 6 is a cross-sectional view along line II–II' in FIG. 5.

FIGS. 5 and 6 illustrate formation of stacked capacitors according to another embodiment of the present invention. FIG. 5 is a top view of stacked capacitors formed according to this alternative embodiment of the present invention. FIG. 6 is a cross-sectional view along line II–II' in FIG. 5.

Referring to FIGS. 5 and 6, each upper electrode 130b is disposed over an intervening portion of mold layer 110 between two adjacent storage openings 115 to cover the lower electrodes 125 at the sidewalls of the intervening mold layer 110. Referring to FIG. 5, each upper electrode 130b covers an array of four lower electrodes 125 disposed around the intervening portion of the mold layer 110.

Thus, the center of the upper electrode 130b is over the intervening mold layer 110. As a result, portions of two upper electrodes 130b are placed in one storage opening 115. In FIG. 5, the upper electrodes 130b are still disposed along rows and columns over the substrate 100.

Referring to FIG. 6, an interconnection contact hole 133' is formed through the upper insulating layer 132 to expose a region of each of the upper electrodes 130b on the intervening mold layer 110. Therefore, the depth of the interconnection contact hole 133' is reduced to decrease an aspect ratio thereof for easier formation of the interconnection contact hole 133'. The interconnection plug 134' fills the interconnection contact hole 133', and interconnections 135' are disposed on the upper insulating layer 132 to connect the interconnection plugs 134'.

Figure 7:
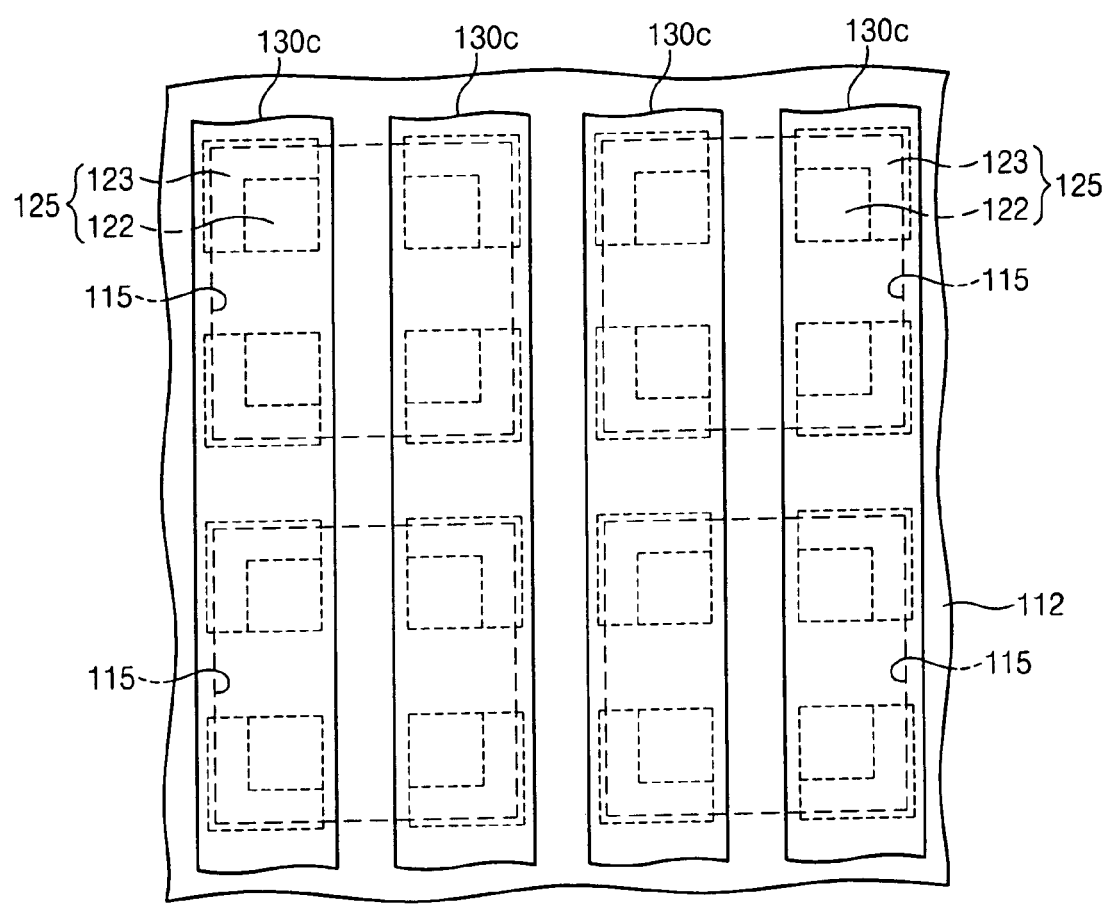
FIG. 7 is a top view with modification of upper electrodes of the stacked capacitors according to another embodiment of the present invention.

Alternatively, if each upper electrode 130b is continuous along a column of storage openings 115, the interconnection plugs 134' and the interconnections 135' may be omitted. In another embodiment of the present invention, as illustrated in FIG. 7, each upper electrode 130c has a line-shape that extends over a column of lower electrodes 125. When the stacked capacitors of FIG. 7 form a ferroelectric memory device, intrinsic capacitance between neighboring stacked capacitors is reduced in the embodiment of FIG. 7.

With such stacked capacitors of FIGS. 2, 3, 4, 5, 6, and 7, each storage opening 115 holds a plurality of stacked capacitors and thus is larger than an opening holding one stacked capacitor of the prior art. With such a large opening 115, the capacitor dielectric 127 may be formed with a relatively large thickness to reduce leakage current between the lower and upper electrodes of the stacked capacitors and to preserve the polarization hysteresis of the capacitor dielectric 127 comprised of a ferroelectric material. Furthermore with such a large opening 115, the upper electrodes 130a, 130b, or 130c overlap the lower electrodes 125 even for a large thickness of the capacitor dielectric 127.

Additionally with such a large opening 115, the height of the wall part 123 of the lower electrodes 125 is increased within acceptable aspect ratio of the opening 115 for in turn increasing the area and thus the capacitance of the stacked capacitors. Overlap between the lower electrode 125 and the upper electrode 130a over a portion of the capping layer 112 further increases area and thus capacitance of the stacked capacitors.

Figure 8:
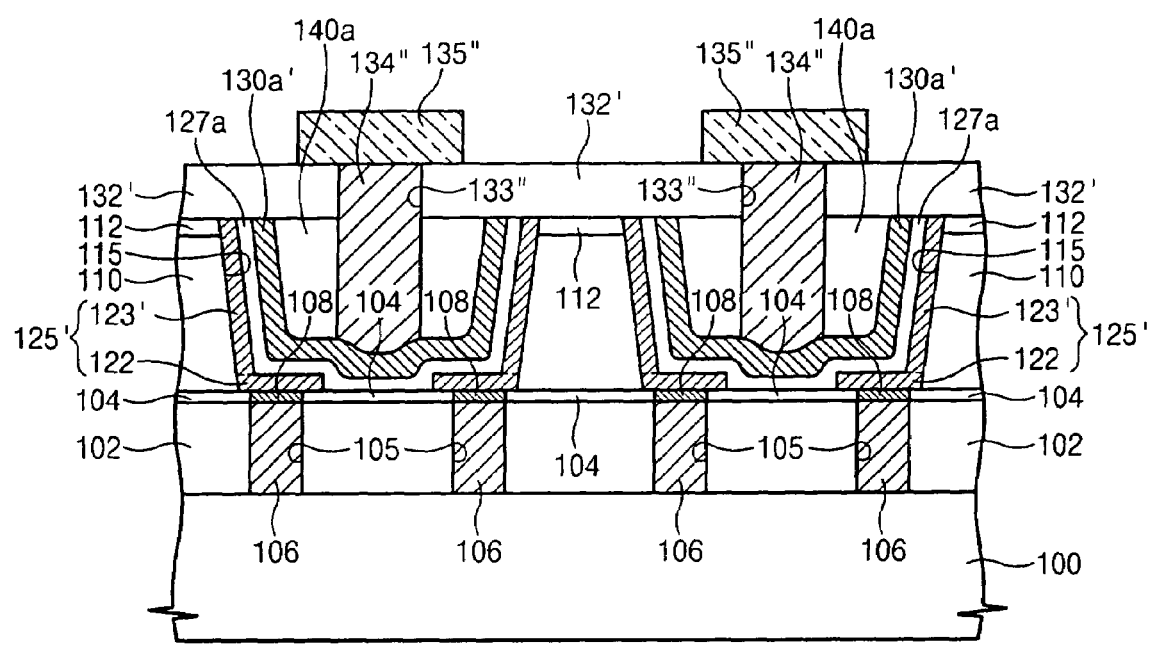
FIG. 8 is a cross-sectional view along line I–I' of FIG. 2 illustrating planarization of the stacked capacitors according to another embodiment of the present invention.

Alternatively, the upper and lower electrodes of the stacked capacitors are planarized with respect to the capping layer 112 to be contained within the opening 115 as illustrated in the cross-sectional view of FIG. 8. Referring to FIG. 8, a wall part 123' of the lower electrodes 125', the capacitor dielectric 127a, and the upper electrode 130a have been polished away in a CMP (chemical mechanical polish) process from the top surface of the capping layer 112 to be contained within the opening 115. Other-wise, the stacked capacitors of FIG. 8 are similar to those of FIG. 3.

Further referring to FIG. 8, a buffer insulating material 140a is disposed on the upper electrode 130a' to fill the storage opening 115. The buffer insulating material 140a is also planarized to the second capping layer 112 to be contained within the storage opening 115, Alternatively, the upper electrode 130a' fills the storage opening 115, and the buffer insulating material 140a is omitted in that case.

Referring to FIG. 8, an upper insulating layer 132' covers the above resultant structure. An interconnection plug 134" fills an interconnection contact hole 133" formed through the upper insulating layer 132' and the buffer insulating material 140a to contact the upper electrode 130a'. The interconnection 135" is disposed on the upper insulating layer 132' to contact the interconnection plug 134".

Further referring to FIG. 8, an encapsulating layer (not shown) may be formed as part of the buffer insulating material 140a and/or the upper insulating layer 132' to cover the lower electrode 125', the capacitor dielectric 127a, and the upper electrode 130a'. The encapsulating layer is comprised of $Al_2O_3$, $TiO_2$, or a combination thereof, in an embodiment of the present invention.

In the embodiment of FIG. 8, the lower electrodes 125', the capacitor dielectric 127a, the upper electrode 130a', and the buffer insulating material 140a are planarized to be contained within the opening 115. Such a resulting flat step coverage allows for easier subsequent deposition of integrated circuit materials thereon for improving fabrication yield.

FIGS. 9A through 12A are top views illustrating steps for fabricating the stacked capacitors of FIG. 3, according to an embodiment of the present invention. FIGS. 9B through 12B are cross-sectional views along line III–III' of FIGS. 9A through 12A, respectively.

Figure 9A:
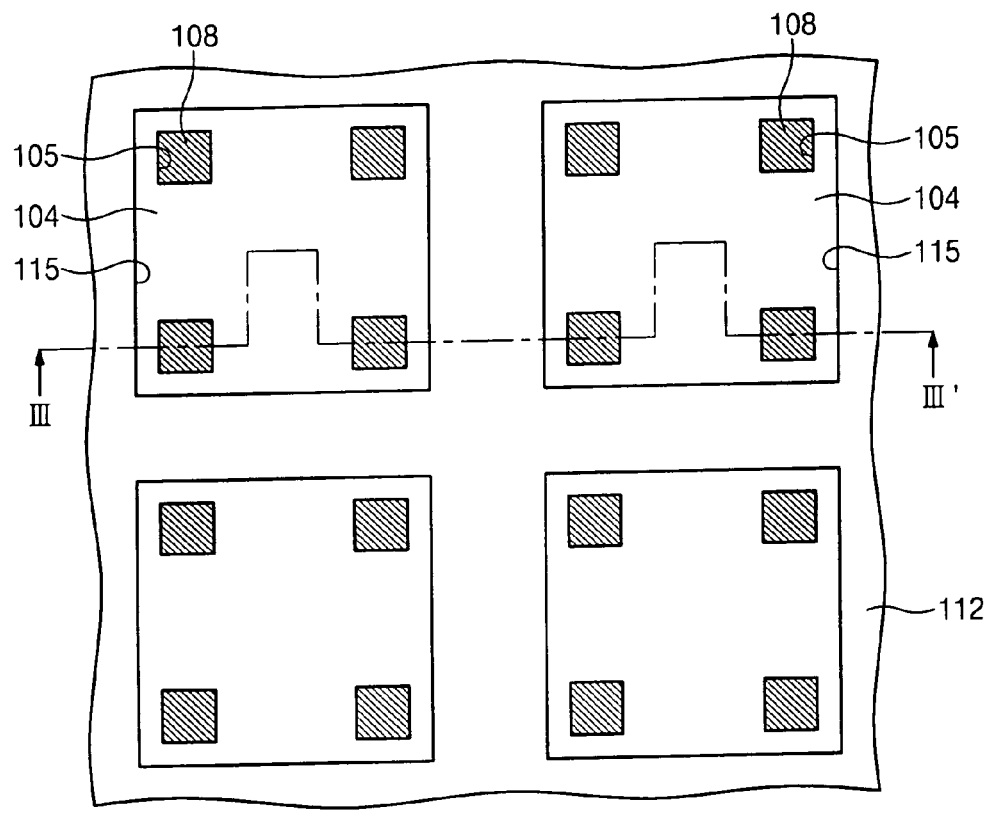
Figure 9B:
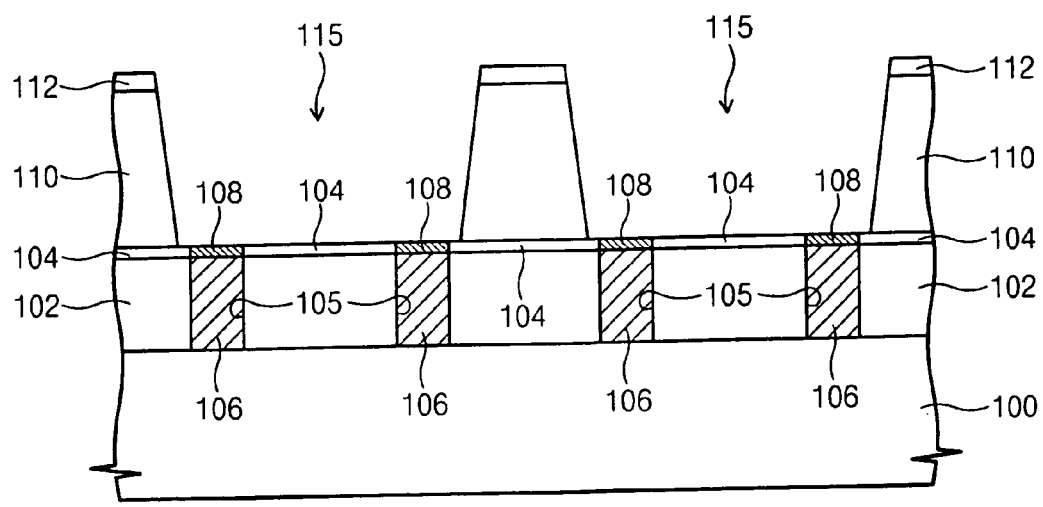

Referring to FIGS. 9A and 9B, the lower insulating layer 102 and the etch stop layer 104 are sequentially deposited on the substrate 100. In addition, the etch stop layer 104 and the lower insulating layer 102 are patterned to form the contact holes 105 over regions of the substrate 100. The contact holes are arranged along rows and columns over the substrate 100.

The respective contact plug 106 is formed to fill each contact hole 105 and is comprised of a conductive material such as doped polysilicon or tungsten or of a metal nitride such as titanium nitride or tantalum nitride, in one embodiment of the present invention. An upper portion of each contact plug 106 is recessed using an etch back process, and the oxygen barrier pattern 108 is formed therein. The oxygen barrier pattern 108 is comprised of a conductive material that prevents oxygen penetration, for example a metal nitride such as titanium nitride (TiN), tantalum nitride (TaN) or aluminum silicon nitride (AlSiN), in one embodiment of the present invention. The present invention may be practiced with or without formation of the oxygen barrier pattern 108.

Thereafter, the mold layer 110 and the capping layer 112 are sequentially blanket deposited over the substrate 100. The lower insulating layer 102 and the mold layer 110 are comprised of silicon dioxide ($SiO_2$) in one embodiment of the present invention. The etch stop layer 104 is comprised of an insulating material having etch selectivity from the mold layer 110.

The capping layer 112 and the mold layer 110 are patterned to form the plurality of storage openings 115. Each storage opening 115 exposes the respective plurality of the oxygen barrier patterns 108. For example, each storage opening 115 exposes an array of four oxygen barrier patterns 108 as illustrated in FIG. 9A. In addition in FIG. 9A, each exposed oxygen barrier pattern 108 is disposed adjacent a respective corner of the storage opening 115 that is square-shaped. FIG. 9A illustrates the buried contact hole 105 and the storage opening 115 as square-shaped, but the present invention may also be practiced when the corners thereof are rounded.

Referring to FIGS. 10A, 10B, 11A and 11B, a lower conductive layer 117 is deposited over the substrate 100 having the storage openings 115. The lower conductive layer 117 is comprised of a noble metal such as iridium (Ir), ruthenium (Ru), or platinum (Pt). In addition, the lower conductive layer 117 may also include an adhesion layer and/or a barrier layer as already described with reference to FIG. 3.

Such a buried layer may prevent the material of the lower conductive layer 117 from penetrating into the mold layer 110 and the like. When the lower conductive layer 117 includes the barrier layer, the oxygen barrier pattern 108 may be omitted.

Figure 10A:
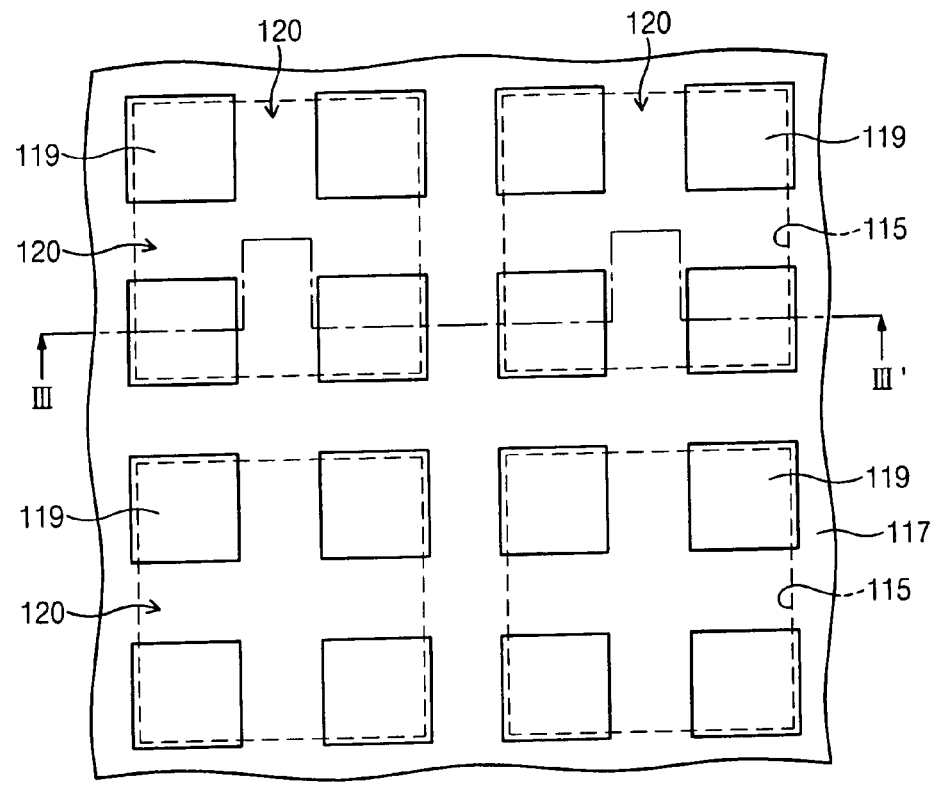
Figure 10B:
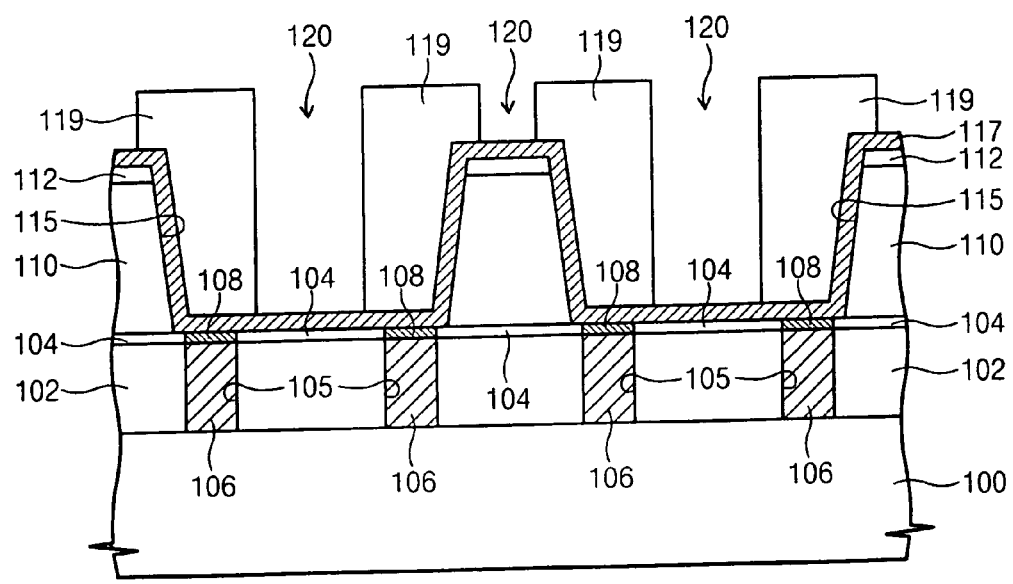

Thereafter, a photoresist layer 119 is patterned on the lower conductive layer 117 to form a photoresist opening 120 that exposes regions of the lower conductive layer 117. Referring to FIG. 10A, the photoresist opening 120 is mesh-shaped with grooves crossing over the storage openings 115. Thus, the remaining photoresist 119 covers portions of the upper conductive layer 117 at the inner corners of the storage opening 115.

Using the patterned photoresist layer 119 as a mask, the lower conductive layer 117 is etched to form the plurality of lower electrodes 125. A portion of the etch stop layer 104 within each storage opening 115 and the capping layer 112 outside of the storage openings 115 are exposed.

Figure 11A:
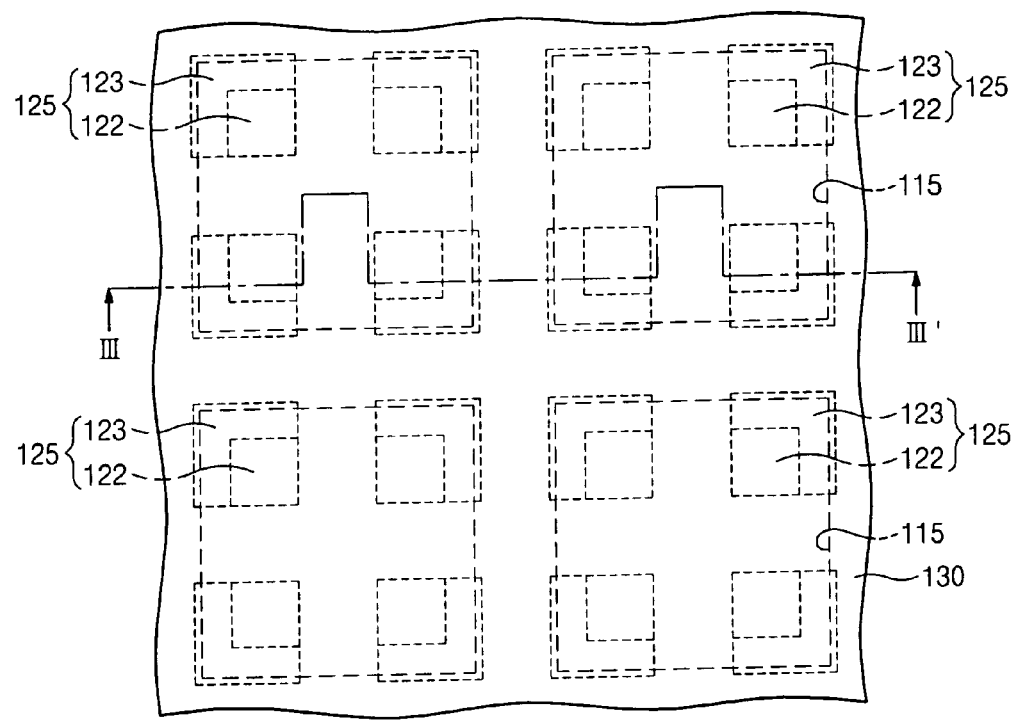
Figure 11B:
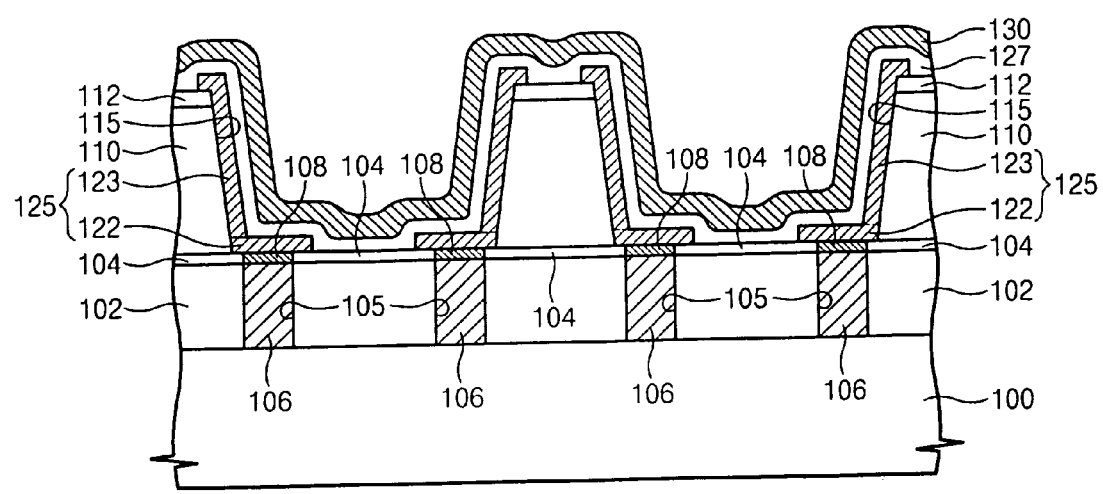

Each lower electrode 125 includes a respective support part 122 and a respective wall part 123. The support part covers a respective oxygen barrier pattern 108, and the wall part 123 extends upward from the support part 122 along at least one sidewall of the storage opening 115. In the example of FIG. 11A, the wall part 123 extends upward along the two sidewalls at a corner of the storage opening 115.

In the storage opening 115 of FIG. 11A, each of four lower electrodes 125 is formed over a respective one of four oxygen barrier patterns 108 disposed at a respective corner of the square-shaped storage opening 115. The four lower electrodes 125 are separate and electrically isolated from each-other. In addition, a top portion of the wall part 123 protrudes laterally over a portion of the capping layer 112 from a process (i.e., overlap) margin of a photolithography process for patterning the lower electrodes 125.

Referring back to FIG. 9B, the sidewalls of the storage openings 115 are formed to be inclined when an isotropic (non-directional) etch process is used for patterning the storage openings 115. The degree of inclination of such sidewalls of the storage opening 115 is determined by a thickness of the mold layer 110, a width of the mold layer 110 positioned between adjacent storage openings 115, and conditions of the etch process. In that case, the lower conductive layer 117 is patterned using an anisotropic (directional) etch process.

Alternatively, when the sidewalls of the storage opening 116 are not significantly inclined, the lower conductive layer 117 is patterned using an isotropic (non-directional) etch process. With such an isotropic etch process, the lower electrodes 125 becomes further separated than defined by the pattern of the photoresist layer 119.

After formation of the lower electrodes 125, the photoresist layer 119 is removed to expose the lower electrodes 125. Thereafter, a capacitor dielectric 127 is conformally deposited over the substrate 100 to cover the lower electrodes 125. Subsequently, an upper conductive layer 130 is formed on the capacitor dielectric 127.

Figure 12A:
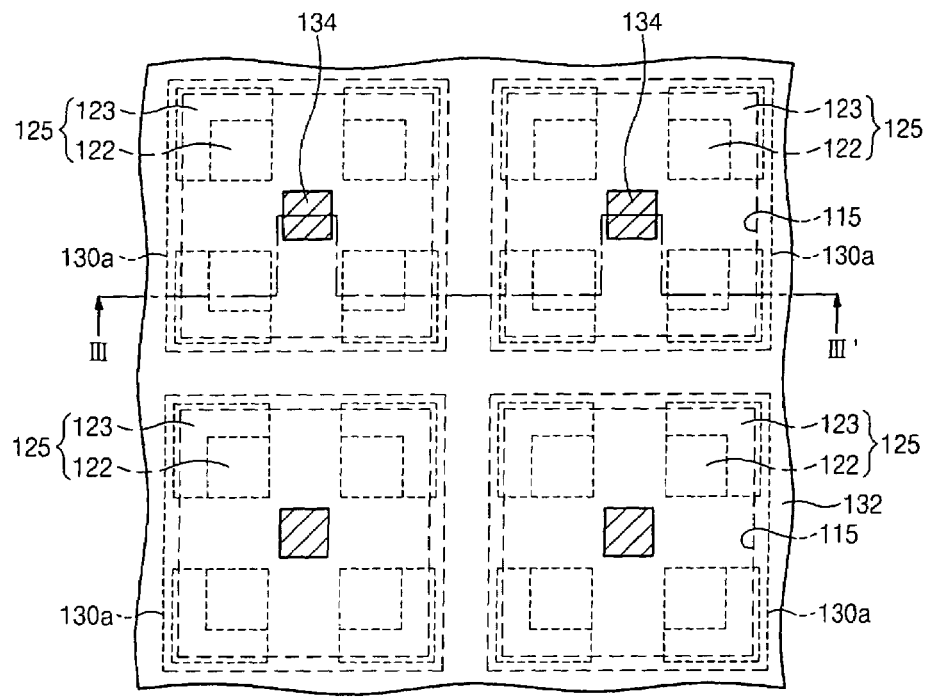
Figure 12B:
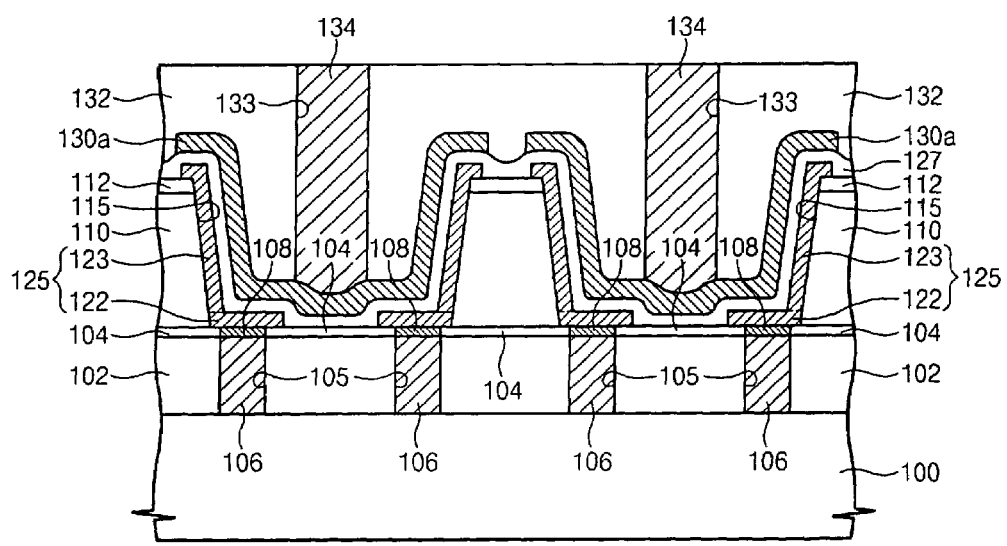

Referring to FIGS. 12A and 12B, the upper conductive layer 130 is patterned to form upper electrodes 130a of the stacked capacitors. A respective upper electrode 130a is patterned for each of the openings 115. Thereafter, an encapsulating layer (not shown) is formed over the substrate 100 to prevent degradation of the upper electrodes 130a, the capacitor dielectric 127, and the lower electrodes 125. Such an encapsulating layer is comprised of $Al_2O_3$, $TiO_2$, or a combination thereof, in one embodiment of the present invention.

Alternatively, the upper conductive layer 130 may be patterned differently to form the upper electrodes 130b or 130c of FIGS. 5 or 7. In addition, the upper conductive layer 130 may be patterned to form the upper electrode that extends continuously through columns of openings 115 using an isotropic etch process. Such an isotropic etch process is amenable for etching the upper conductive layer 130 on the non-inclined sidewalls of the opening 115. Alternatively for inclined sidewalls of the opening 115, the upper conductive layer 130 is patterned using an anisotropic etch process.

Further referring to FIGS. 12A and 12B, an upper insulating layer 132 is blanket deposited over the substrate 100 having the upper electrodes 130a. The upper insulating layer 132 fills the storage opening 115 in one embodiment of the present invention.

Thereafter, the upper insulating layer 132 is patterned to form a plurality of interconnection contact holes 133. Each interconnection contact hole 133 exposes a center region of the upper electrode 130a in one embodiment of the present invention.

A respective interconnection plug 134 is formed to fill each interconnection contact hole 133. The interconnection 135 of FIGS. 2 and 3 is further formed on the upper insulating layer 132. Alternatively, as illustrated in FIGS. 5 and 6, the interconnection contact hole 133' and the interconnection plug 134' are formed over the intervening portion of the mold layer 110 between adjacent storage openings 115.

FIGS. 13A through 15A are top views illustrating steps for fabricating the planarized stacked capacitors of FIG. 8, according to an embodiment of the present invention. FIGS. 13B through 15B are cross-sectional views along line IV–IV' in FIGS. 13A through 15A, respectively.

Figure 13A:
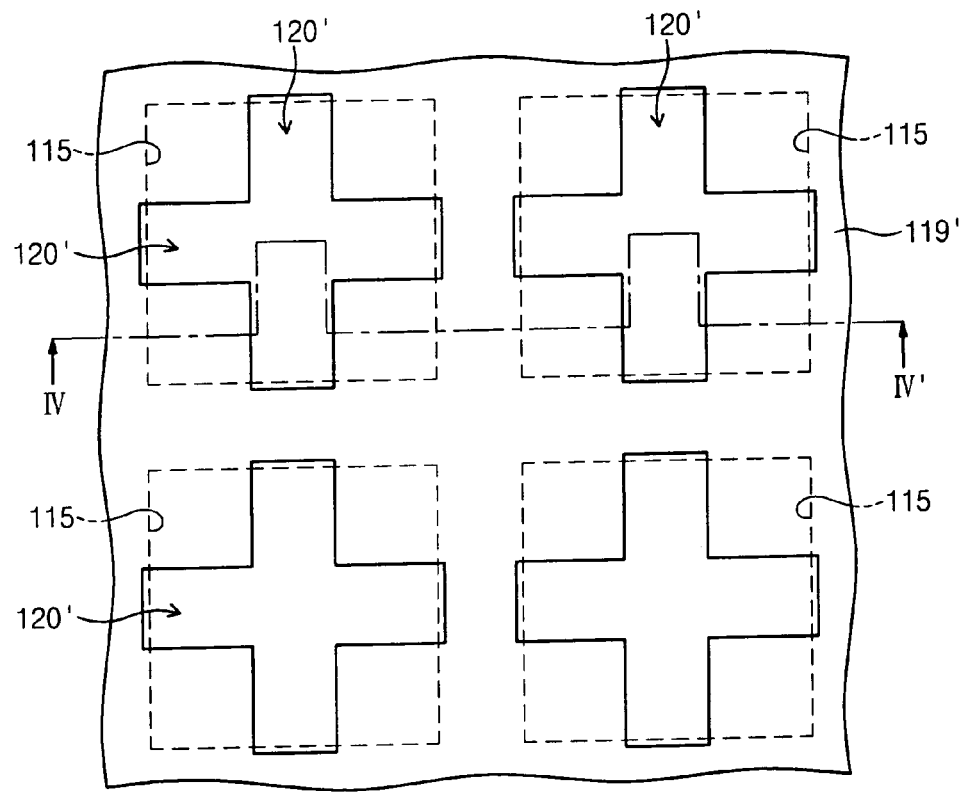
Figure 13B:
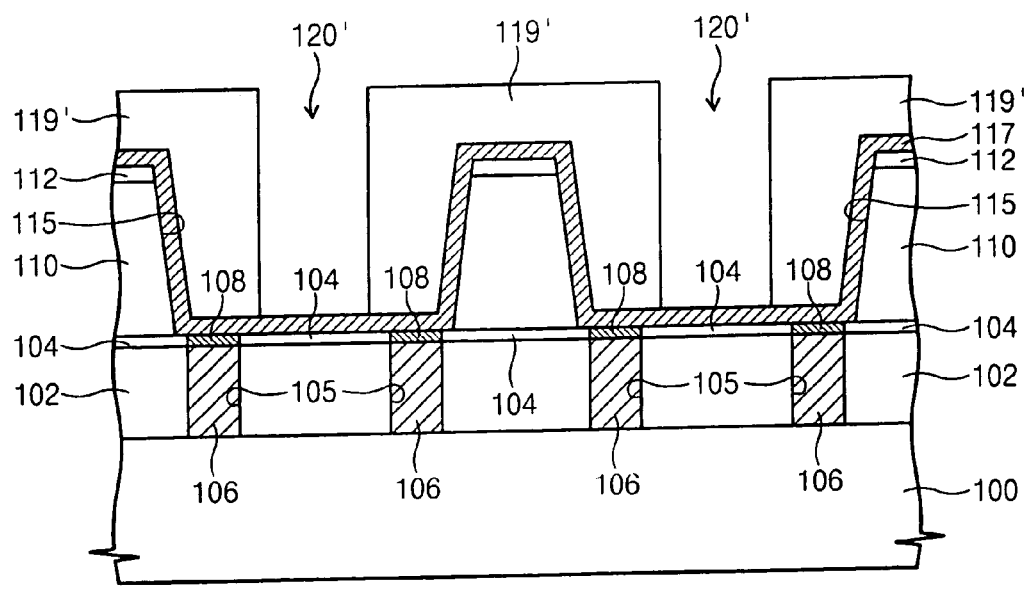
Figure 14A:
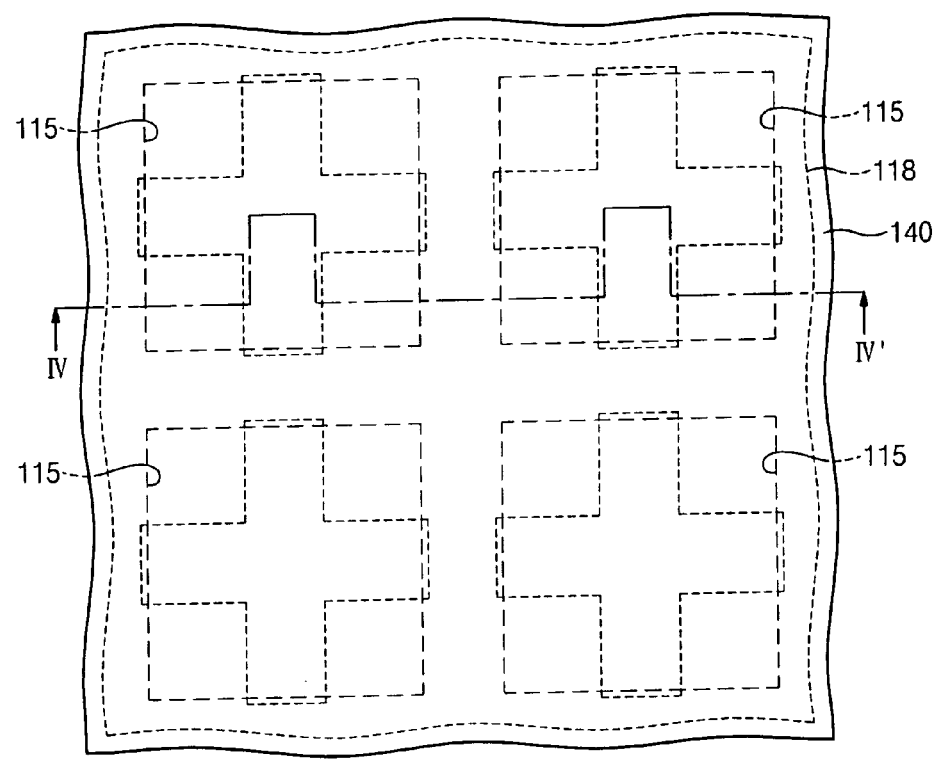
Figure 14B:
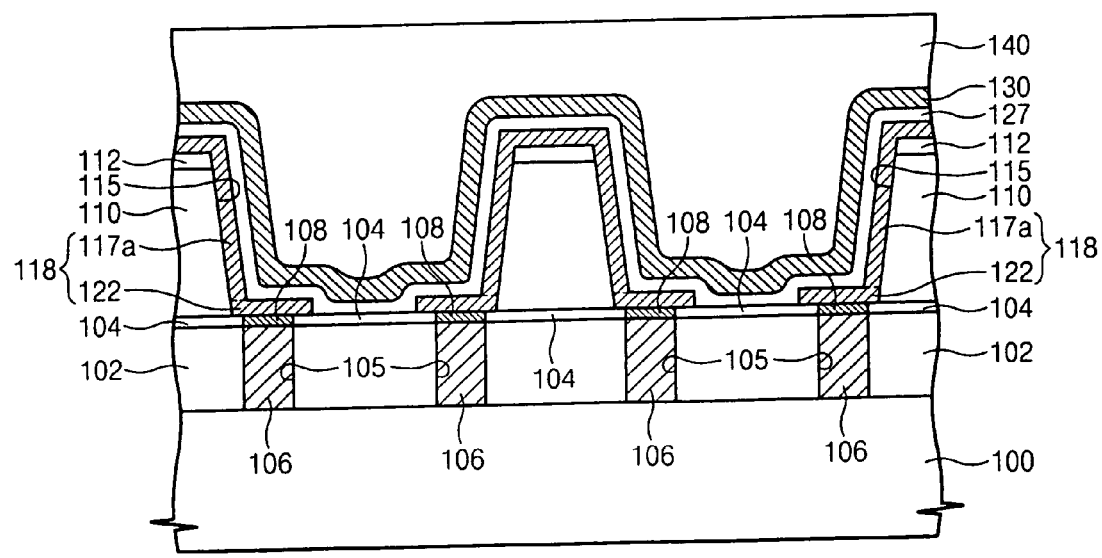

Referring to FIGS. 13A, 13B, 14A and 14B, after the lower conductive layer 117 is conformally deposited, a respective photoresist opening 120' is formed over each opening 115. The photoresist opening 120' has a cross-shaped as illustrated in FIG. 13A. Portions of the lower conductive layer 117 exposed through the photoresist opening 120' are etched away. In FIG. 13A, the photoresist opening 120' exposes a portion of the capping layer 112 for a process margin of the photolithography process. However, the photoresist layer 119' covers most of the lower conductive layer 117 on the capping layer 112.

Using the photoresist layer 119' as a mask, the lower conductive layer 117 is etched to form a preliminary lower electrode layer 118. The preliminary lower electrode layer 118 includes a plurality of support parts 122 and a preliminary wall pattern 117a. Each support part 122 contacts a top surface of a respective oxygen barrier pattern 108.

The preliminary wall pattern 117a includes a plane part formed on the capping layer 112 and a plurality of extended parts along the sidewalls at corners of the openings 115. The lower conductive layer 117 is etched in an isotropic (non-directional) etch when the preliminary wall pattern 117a is formed on non-inclined sidewalls of the opening 115. Alternatively, the lower conductive layer 117 is etched in an anisotropic (directional) etch when the preliminary wall pattern 117a is formed on inclined sidewalls of the opening 115.

Thereafter, the photoresist layer 119' is removed to expose the preliminary lower electrode layer 118. The capacitor dielectric 127 is conformally deposited to cover the preliminary lower electrode layer 118. Subsequently, an upper conductive layer 130 is formed on the capacitor dielectric 127. A buffer insulating material 140 is formed on the upper conductive layer 130 to fill the storage opening 115. The buffer insulating material 140 is comprised of silicon dioxide ($SiO_2$) in one embodiment of the present invention.

Figure 15A:
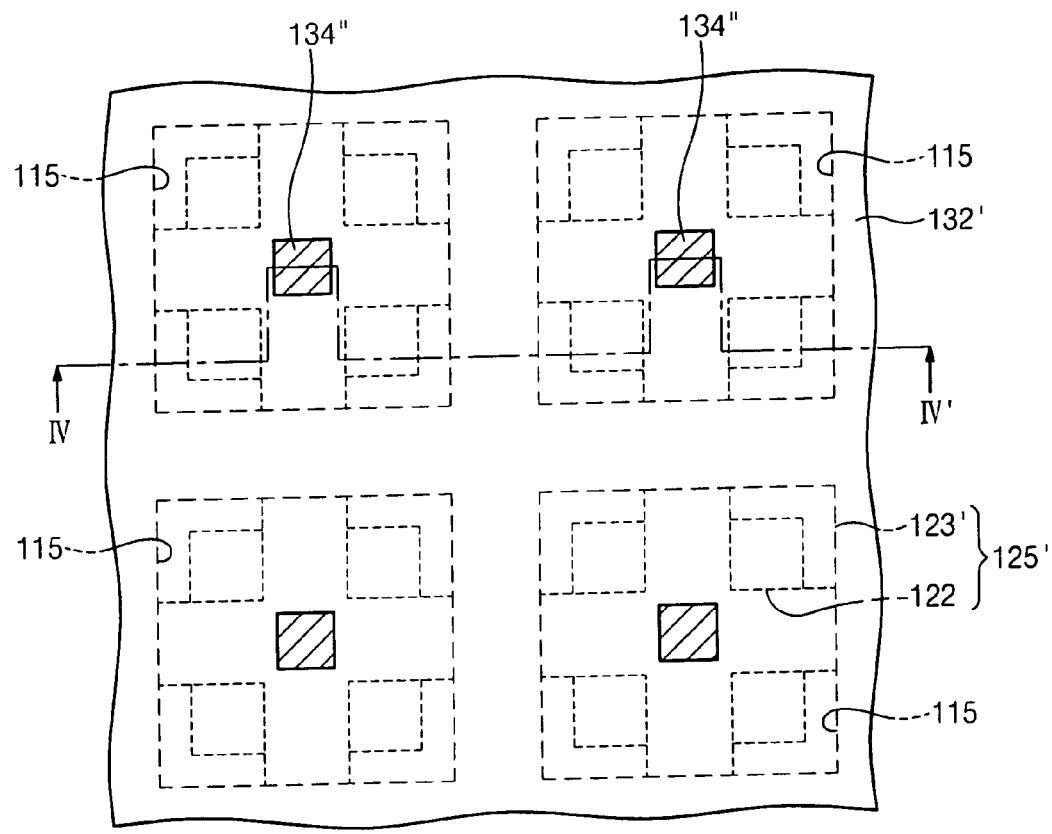
Figure 15B:
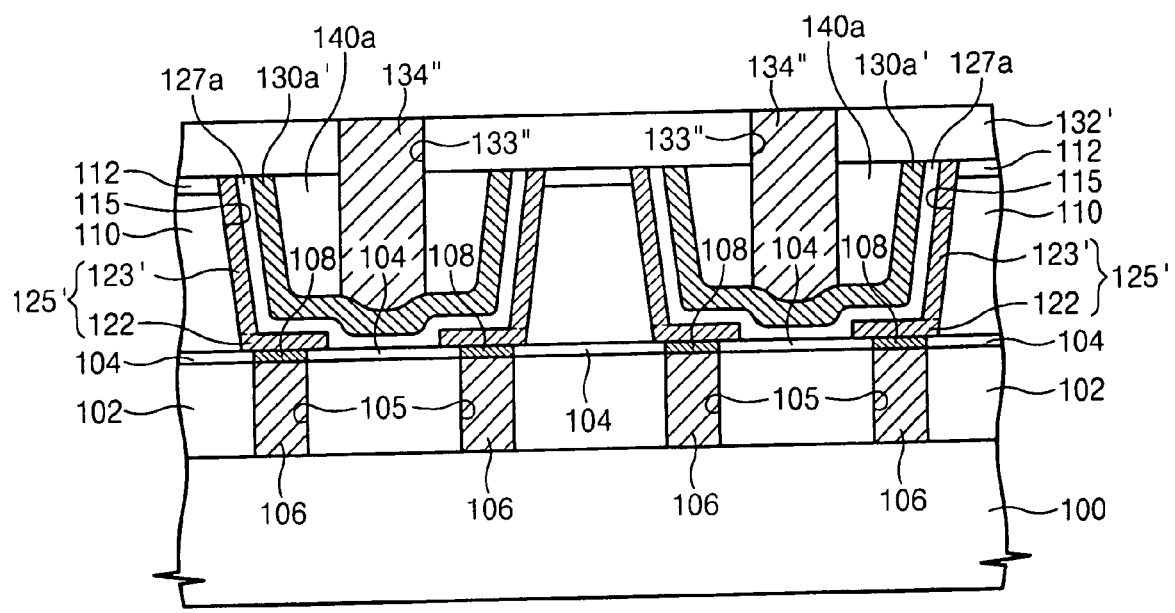

Referring to FIGS. 15A and 15B, the buffer insulating material 140, the upper conductive layer 130, the capacitor dielectric 127, and the preliminary lower electrode layer 118 are planarized in an CMP (chemical mechanical polishing) process until the capping layer 112 is exposed. The remaining lower electrodes 125', the capacitor dielectric 127a, the upper electrode 130a', and the buffer insulating material 140a are contained within the opening 115. Alternatively, when the upper conductive layer 130 fills the storage opening 115, the buffer insulating material 140 is omitted.

Each lower electrode 125' in FIG. 15B includes a respective support part 122 that covers a respective oxygen barrier pattern 108. Each lower electrode 125' includes a respective wall part 123' that extends upward from the support part 122 along sidewalls at a respective corner of the storage opening 115. Further referring to FIG. 15B, an upper insulating layer 132' is deposited over the substrate 100. An encapsulating layer (not shown) may also be formed as part of the upper insulating layer 132'. Such an encapsulating layer is comprised of $Al_2O_3$, $TiO_2$, or a combination thereof in one embodiment of the present invention.

Thereafter in FIG. 15B, the upper insulating layer 132' and the buffer insulating material 140a are patterned to form an interconnection contact hole 133" to expose a center region of the upper electrode 130a'. An interconnection plug 134" is formed to fill the interconnection contact hole 133". In addition, an interconnection 135" as illustrated in FIG. 8 is further formed on the upper insulating layer 132'.

Figure 16:
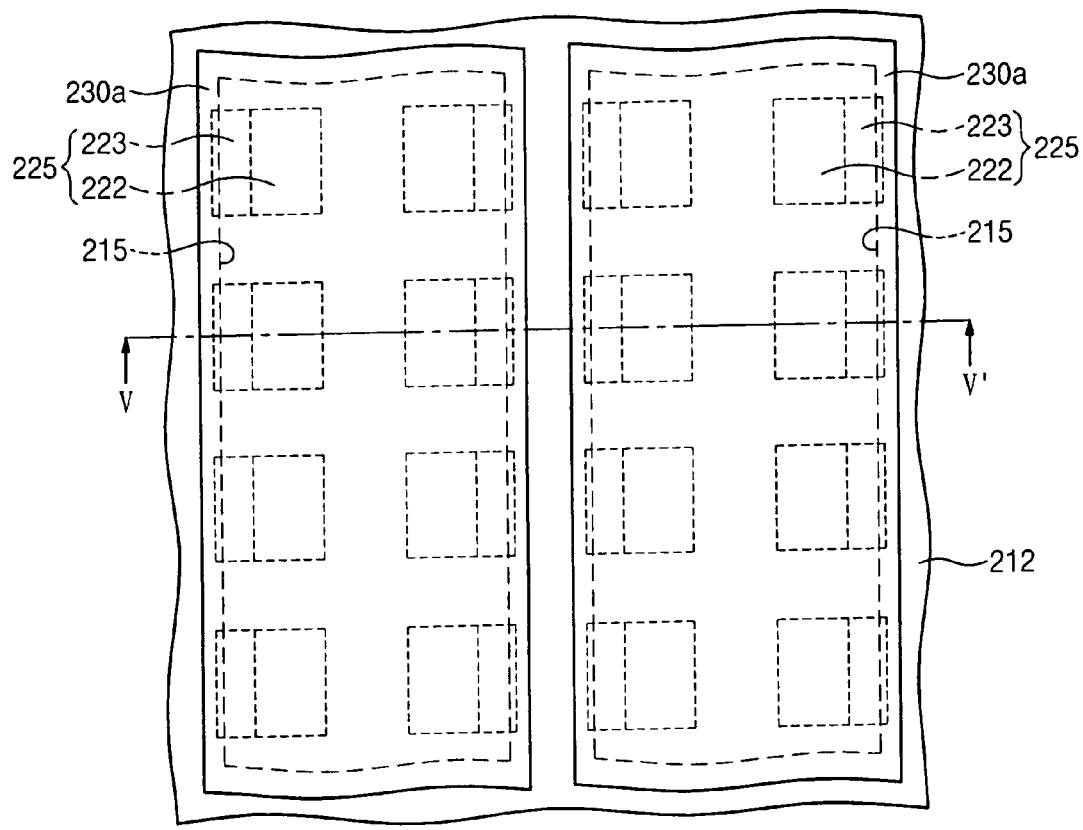
FIG. 16 is a top view of stacked capacitors formed within an opening having a groove shape, according to another embodiment of the present invention.
Figure 17:
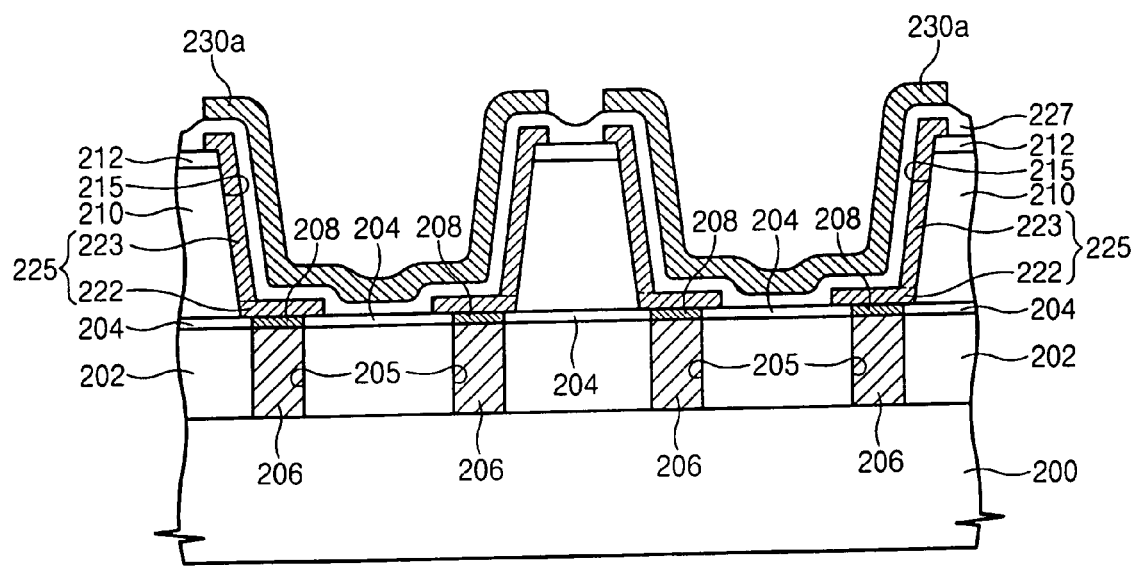
FIG. 17 is a cross-sectional view along line V–V' in FIG. 16.

FIG. 16 is a top view of stacked capacitors formed within an opening 215 having a groove shape according to another embodiment of the present invention. FIG. 17 is a cross-sectional view along line V–V' in FIG. 16, and FIG. 18 is an isometric view of lower electrodes of the stacked capacitors of FIG. 16.

Figure 18:
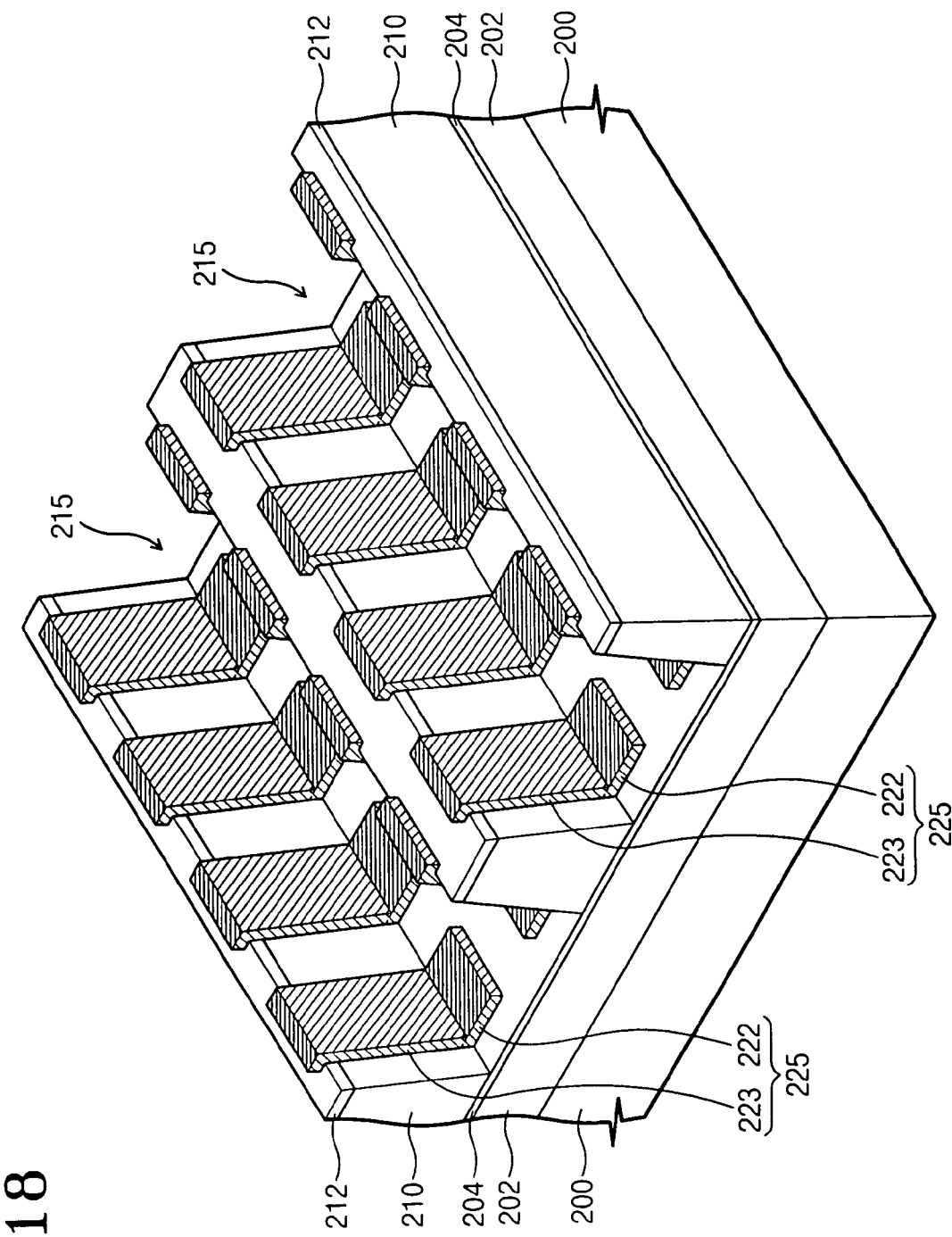
FIG. 18 is an isometric view of lower electrodes of the stacked capacitors of FIG. 16.

Referring to FIGS. 16, 17, and 18, a lower insulating layer 202 and an etch stop layer 204 are deposited on a semiconductor substrate 200. A plurality of contact holes 205 are formed through the etch stop layer 204 and the lower insulating layer 202 to expose regions of the substrate 200. The contact holes 205 are arranged in rows and columns. A respective contact plug 206 and a respective oxygen barrier pattern 208 fill each contact hole 205.

A mold layer 210 is deposited to cover the etch stop layer 204 and the oxygen barrier pattern 208. A capping layer 212 is deposited on the mold layer 210. The etch stop layer 204 is comprised of an insulating material having etch selectivity from the mold layer 210.

Parallel groove-shaped storage openings 215 are formed through the capping layer 212 and the mold layer 210 to expose the oxygen barrier patterns 208 along a column direction, in one embodiment of the present invention. In the embodiment of FIG. 16, each of two columns of exposed oxygen barrier patterns 208 are disposed adjacent to a respective one of two sidewalls of the storage opening 215. Such sidewalls of the opening 215 may be inclined with a distance between the sidewalls increasing upward in the opening 215.

A respective lower electrode 225 is patterned over each oxygen barrier patterns 208 in the storage opening 215. Each lower electrode 225 includes a respective support part 222 and a respective wall part 223. The support part 222 contacts a respective oxygen barrier pattern 208, and the wall part 223 extends upward from the support part 222 along a sidewall of the opening 215.

A pair of lower electrodes 225 is formed on opposite sidewalls of the opening 215 to face each other, in one embodiment of the present invention. A top portion of the wall part 223 extends laterally over a portion of the capping layer 212. The lower electrodes 225 within each storage opening 215 are separate and electrically isolated from each other. In addition, the lower electrodes 225 disposed in different storage openings 215 are separate and electrically isolated from each other.

The lower electrodes 225 are comprised of a noble metal such as iridium (Ir) or ruthenium (Ru) in one embodiment of the present invention. In addition, the lower electrodes 225 may include an adhesion layer and/or a barrier layer, similarly as described with reference to FIGS. 3, 6, and 12B.

After formation of the lower electrodes 225, a capacitor dielectric 227 is conformally deposited to cover the lower electrodes 225. Subsequently, an upper electrode 230a is formed on the capacitor dielectric 227 over the lower electrodes 225. Each upper electrode 230a may cover all of the lower electrodes 225 in the cell block (not shown) of a memory device. Alternatively, each upper electrode 230a covers one storage opening 215 as illustrated in FIG. 16. When the capacitor dielectric 227 is comprised of a ferroelectric material for using the stacked capacitors in a ferroelectric memory device, the upper electrode 230a forms a plate line of the ferroelectric memory device.

Alternatively similar to FIG. 6, the upper electrode 230a may be formed over an intervening portion of the mold layer 210 between adjacent storage openings 215. Alternatively similar to FIG. 7, each upper electrode 230a may be formed over a column of lower electrodes 225 along one sidewall of the groove-shaped opening 215.

Figure 19:
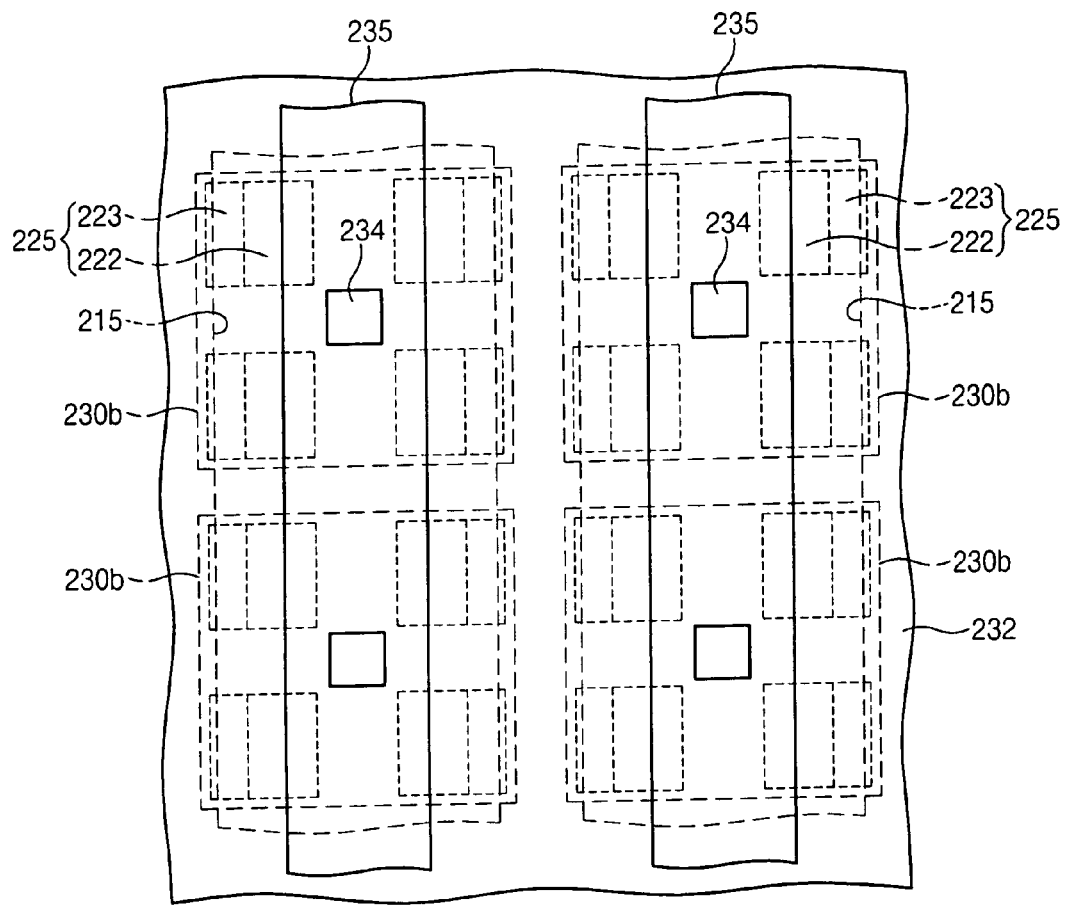
FIG. 19 is a top view with square-shaped upper electrodes along the groove-shaped opening, according to another embodiment of the present invention.

Alternatively as illustrated in FIG. 19, each lower electrode 230a is electrically isolated to cover an array of four adjacent lower electrodes 225 within the groove-shaped opening 215. In that case, a plurality of upper electrodes 230b is formed along each groove-shaped opening 215.

An upper insulating layer 232 is blanket deposited on the substrate 200 to cover the upper electrodes 230b. Each interconnection plug 234 is formed through the upper insulating layer 232 to contact a respective upper electrode 230b. Interconnections 235 are arranged parallel on the upper insulating layer 232, and each interconnection is coupled to a column of the interconnection plugs 234.

With such stacked capacitors of FIGS. 16, 17, 18, and 19, each groove-shaped storage opening 215 is formed to be relatively wide for holding a plurality of stacked capacitors therein. With such a large opening 215, the capacitor dielectric 227 may be formed with a relatively large thickness to reduce leakage current between the lower and upper electrodes of the stacked capacitors and to preserve the polarization hysteresis of the capacitor dielectric 227 comprised of a ferroelectric material. Furthermore with such a large opening 215, the upper electrode 230a overlap the lower electrodes 225 even for large thickness of the capacitor dielectric 227.

Additionally with such a large opening 215, the height of the wall part 223' of the lower electrodes 225 is further increased within acceptable aspect ratio of the opening 215 for in turn increasing area and thus capacitance of the stacked capacitors. Overlap between the lower electrode 225 and the upper electrode 230a over a portion of the capping layer 212 further increases area and thus capacitance of the stacked capacitors.

Figure 20:
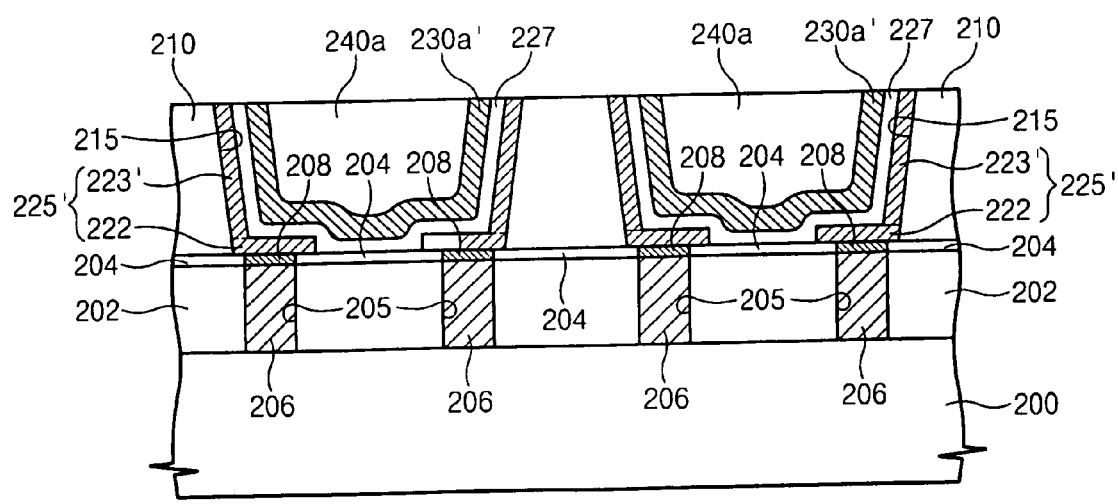
FIG. 20 is a cross-sectional view along line V–V' in FIG. 16 with planarization of the stacked capacitors, according to another embodiment of the present invention.

FIG. 20 is a cross-sectional view along line V–V' in FIG. 16 with planarization of the stacked capacitors, according to another embodiment of the present invention. Referring to FIG. 20, each lower electrode 225' includes a respective support part 222 and a respective wall part 223' that is contained within the opening 215. Similar to FIG. 17, a capacitor dielectric 227 is deposited on the lower electrodes 225' and an upper electrode 230a' is deposited on the capacitor dielectric 227. A buffer insulating material 240a is blanket deposited to fill the openings 215.

Thereafter in FIG. 20, the buffer insulating material 240a, the upper electrode 230a', the capacitor dielectric 227, and the lower electrodes 225' are planarized in a CMP (chemical mechanical polish) process. Thus, the buffer insulating material 240a, the upper electrode 230a', the capacitor dielectric 227, and the lower electrodes 225' are contained to be electrically isolated within each storage opening 215.

In an alternative embodiment, the upper electrode 230a' fills the storage opening 215. In that case, the buffer insulating material 240a is omitted. An encapsulating layer (not shown) may be disposed as part of the buffer insulating material 240a to cover the electrodes 225' and 230a' and the capacitor dielectric 227. Such an encapsulating layer prevents degradation of the electrodes 225' and 230a and the capacitor dielectric 227.

In the embodiment of FIG. 20, the lower electrodes 225', the capacitor dielectric 227, the upper electrode 230a', and the buffer insulating material 240a are planarized to be contained within the opening 215. Such a resulting flat step coverage allows for easier subsequent deposition of integrated circuit materials thereon for improving fabrication yield.

Figure 21A:
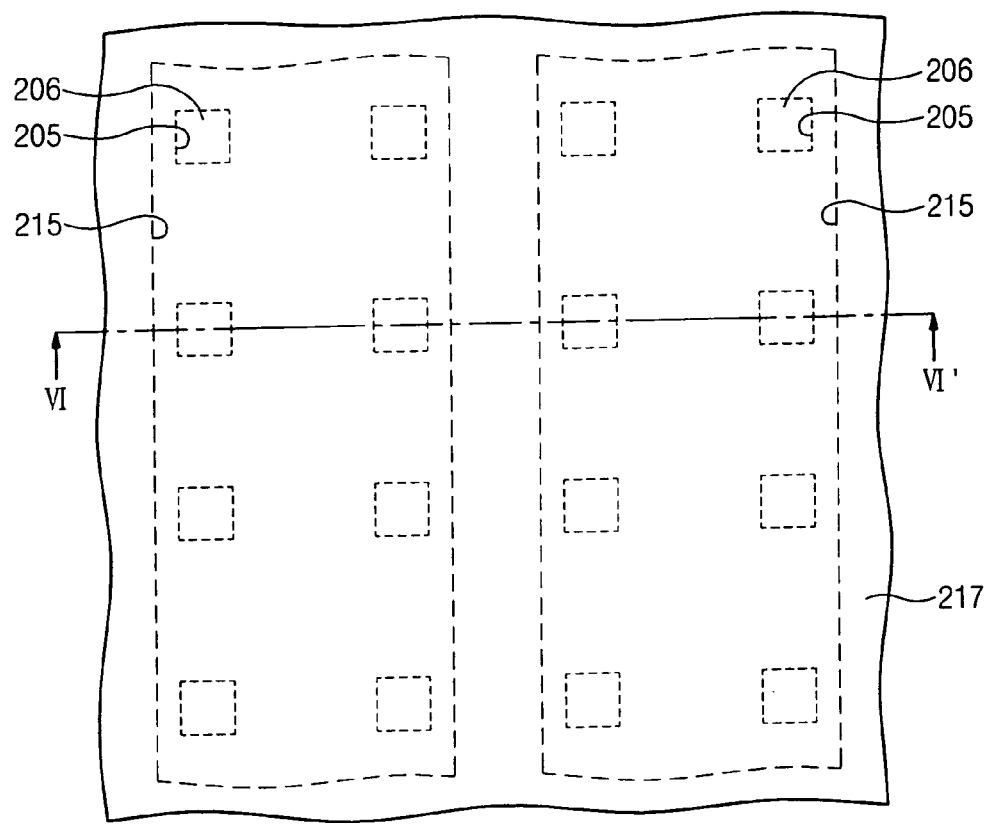
FIGS. 21A and 22A are top views illustrating steps for fabricating the stacked capacitors of FIG. 16 according to an embodiment of the present invention.
Figure 21B:
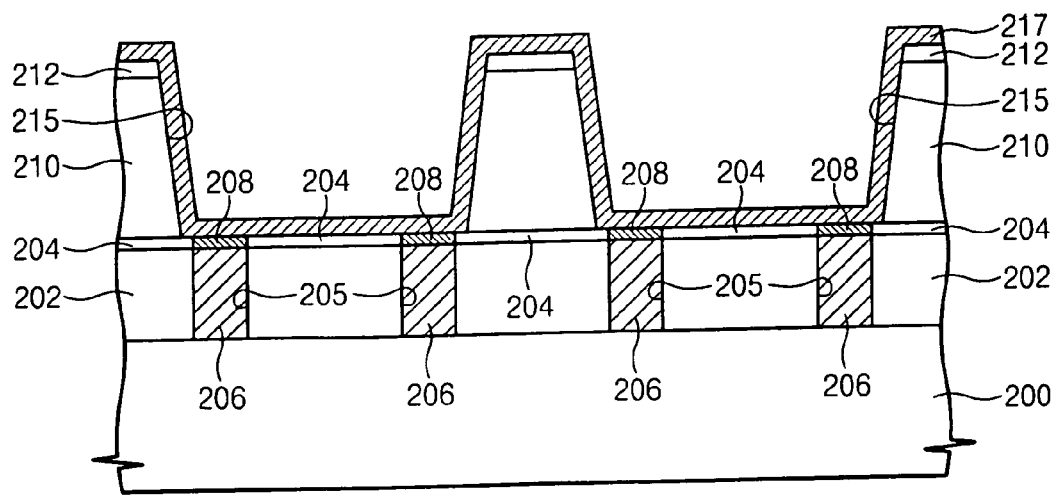
FIGS. 21B and 22B are cross-sectional views along line VI–VI' in FIGS. 21A and 22A, respectively.
Figure 22A:
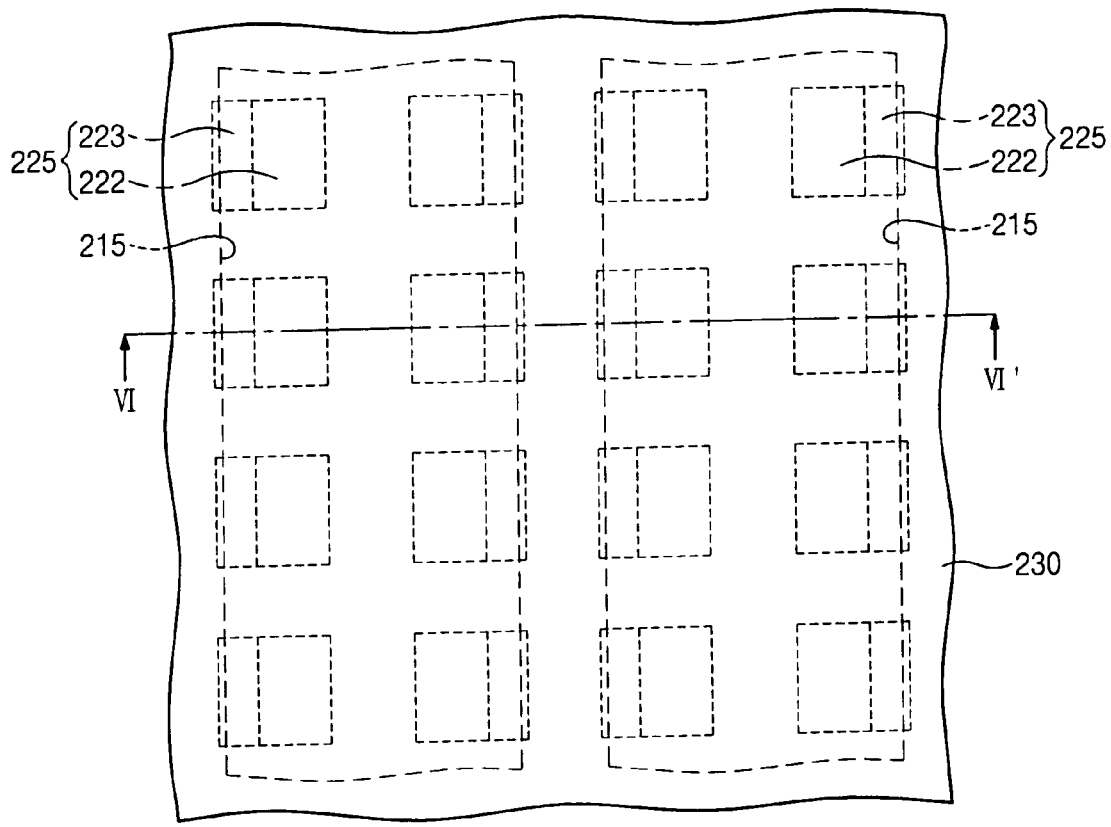
Figure 22B:
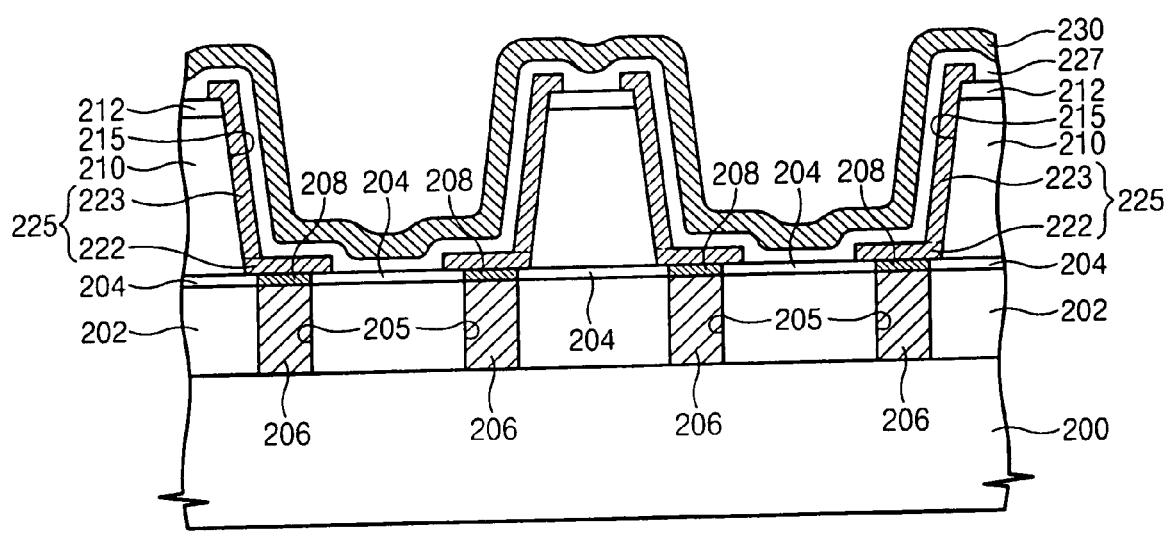

FIGS. 21A and 22A are top views illustrating steps for fabricating the stacked capacitors of FIG. 16 according to an embodiment of the present invention. FIGS. 21B and 22B are cross-sectional views along line VI–VI' in FIG. 21A and 22A, respectively.

Referring to FIGS. 21A and 21B, the lower insulating layer 202 and the etch stop layer 204 are sequentially deposited on the substrate 200. A respective contact plug 206 with a respective oxygen barrier pattern 208 thereon fills each contact hole 205 formed through the etch stop layer 204 and the lower insulating layer 202 as similarly described above for other embodiments of the present invention.

Thereafter, the mold layer 210 and the capping layer 212 are sequentially deposited over the substrate 200. The capping layer 212 and the mold layer 210 are patterned to form the storage openings 215 having a groove-shape and exposing two adjacent columns of the oxygen barrier patterns 208. The storage openings 215 are parallel to each other. The sidewalls of the openings 215 are inclined with a width of the storage opening 215 gradually increasing upward.

A lower conductive layer 217 is conformally deposited over the substrate 200 and within the storage openings 215. The lower conductive layer 217 is comprised of material(s) as described above for the other embodiments of the present invention. Referring to FIGS. 22A and 22B, the lower conductive layer 217 is patterned to form a plurality of lower electrodes 225 each contacting a respective oxygen barrier pattern 208.

Each lower electrode 225 includes a respective support part 222 and a respective wall part 223. The support part 222 contacts a respective oxygen barrier pattern 208, and the wall part 223 extends upward from the support part 222 along a sidewall of the storage opening 215. The lower electrodes 225 are separate and electrically isolated from each other.

For patterning the lower conductive layer 217, an isotropic (non-directional) etch process is used when the lower electrodes 225 are formed on a non-inclined sidewall of the opening 215. Alternatively, an anisotropic (directional) etch is used when the lower electrodes 225 are formed on an inclined sidewall of the opening 215.

Thereafter, a capacitor dielectric 227 is conformally deposited over the substrate 200 to cover the lower electrodes 225. Subsequently, an upper conductive layer 230 is formed on the capacitor dielectric 227. The upper conductive layer 230 is patterned to form upper electrodes 230a of FIGS. 16 and 17. The lower electrodes 225, the capacitor dielectric 227, and the upper electrode 230a form the stacked capacitors of an embodiment of the present invention. After the upper electrode 230a is formed, an encapsulating layer (now shown) is formed over the substrate 200 to prevent degradation of the stacked capacitors.

The upper conductive layer 230 is patterned to form the upper electrodes similarly as described in the above embodiments of the present invention. An isotropic etch process is amenable for etching the upper conductive layer 230 on non-inclined sidewalls of the opening 215. Alternatively for inclined sidewalls of the opening 215, the upper conductive layer 230 is patterned using an anisotropic etch process. Thereafter, an upper insulating layer 232, interconnection plugs 234, and interconnections 235 are formed similarly as described in the above embodiments of the present invention.

Figure 23A:
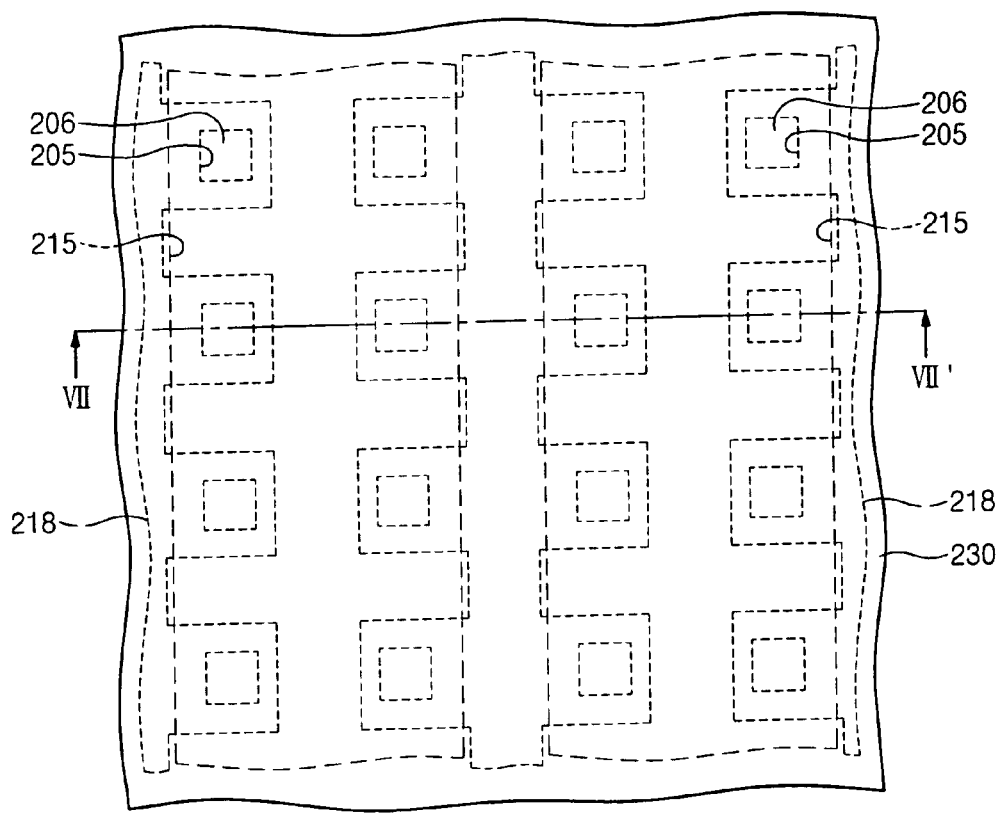
FIG. 23A is a top view and FIG. 23B is a cross-sectional view along line VII–VII' in FIG. 23A, for illustrating fabrication of the stacked capacitors of FIG. 20, according to an embodiment of the present invention.
Figure 23B:
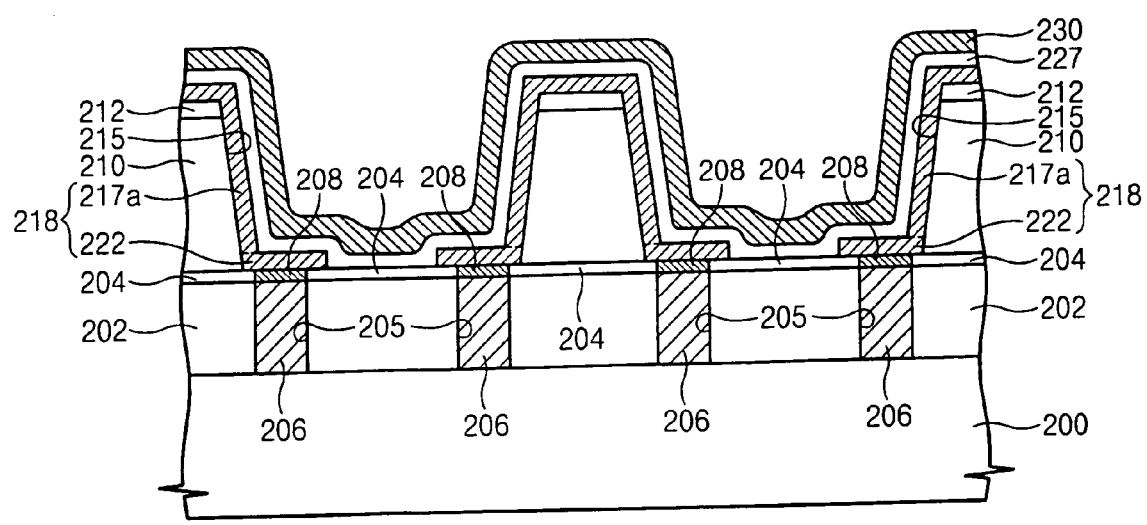

FIGS. 21A and 23A are top views for illustrating fabrication of the stacked capacitors of FIG. 20, according to another embodiment of the present invention. FIGS. 21A and 23B are cross-sectional views along lines VI–VI' and VII–VII' in FIGS. 21A and 23A, respectively.

Referring to FIGS. 21A, 21B, 23A and 23B, a lower conductive layer 217 is conformally deposited over the substrate 200 having the storage openings 215. The lower conductive layer 217 is patterned to form the preliminary lower electrode layer 218 that initially remains over the capping layer 212. The preliminary lower electrode layer 218 also includes a plurality of support parts 222 and a preliminary wall pattern 217a connected to the support parts 222. The temporary wall pattern 217a includes a plane part formed on the capping layer 212 and a plurality of extended parts that extend downward from the plane part along an inner sidewall of the storage opening 215 to be connected to a support part 222.

For forming the preliminary lower electrode layer 218, an isotropic etch process is amenable for non-inclined sidewalls of the opening 215. Alternatively for inclined sidewalls of the opening 215, the lower conductive layer 217 is patterned using an anisotropic etch process.

After formation of the preliminary lower electrode layer 218, a capacitor dielectric 227 is deposited conformally on the substrate 200 to cover the preliminary lower electrode layer 218. Thereafter, an upper conductive layer 230 is formed on the capacitor dielectric 227. The upper conductive layer 230 may be deposited conformally. A buffer insulating material 240 is formed on the upper conductive layer 230 to fill the storage opening 215.

Subsequently, the buffer insulating material 240, the upper conductive layer 230, the capacitor dielectric 227, and the preliminary lower electrode layer 218 are planarized until the capping layer 212 is exposed. With such planarization, lower electrodes 225', a capacitor dielectric 227, an upper electrode 230a', and a buffer insulating material 240a are contained within the openings 215. The preliminary wall pattern 217a becomes separated from the planarization to form wall parts 223' that are electrically isolated.

If the upper conductive layer 230 fills the storage opening 215, the buffer insulating material 240 may be omitted. Alternatively, the present invention may be practiced with a CMP (chemical mechanical polish) process for planarizing the upper conductive layer 230, the capacitor dielectric 227, and the preliminary lower electrode layer 218 with or without the buffer insulating material 240 or the upper conductive layer 230 filling the opening 215.

With such stacked capacitors of the above embodiments of the present invention, a storage opening is formed to be relatively large for holding a plurality of stacked capacitors therein. With such a large opening, the capacitor dielectric may be formed with a relatively large thickness to reduce leakage current between the lower and upper electrodes of the stacked capacitors and to preserve the polarization hysteresis of the capacitor dielectric comprised of a ferroelectric material. Furthermore with such a large opening, the upper electrode overlaps the lower electrodes even for large thickness of the capacitor dielectric.

Additionally with such a large opening, the height of the wall parts of the lower electrodes are increased within acceptable aspect ratio of the opening for in turn increasing the area and thus the capacitance of the stacked capacitors. Overlap between the lower electrode and the upper electrode over a portion of the capping layer further increases area and thus capacitance of the stacked capacitors.

The foregoing is by way of example only and is not intended to be limiting. For example, the present invention herein is described for application of the stacked capacitors in memory devices. However, the stacked capacitors of the present invention may also advantageously be applied for any other types of devices using capacitors. In addition, the materials described herein or any shapes illustrated and described herein are by way of example only. The present invention is limited only as defined in the following claims and equivalents thereof.

What is claimed is:

1. A method of forming a plurality of stacked capacitors, comprising:
   A. forming an opening through at least one insulating material;
   B. patterning a lower electrode material to form a plurality of lower electrodes within the same one opening; and
   C. forming the plurality of stacked capacitors with the plurality of lower electrodes within the same one opening.

2. The method of claim 1, wherein the opening is formed through a capping layer and a molding layer.

3. The method of claim 1, wherein each of the lower electrodes includes a respective support part disposed over a respective conductive plug, and includes a wall part disposed along a respective portion of at least one wall of the opening.

4. The method of claim 1, wherein step B includes:
   depositing conformally the lower electrode material on at least one wall of the opening; and
   patterning the lower electrode material in a photolithography process for forming the lower electrodes.

5. The method of claim 4, wherein the photolithography process includes an isotropic (non-directional) etch when the lower electrodes are formed on at least one non-inclined sidewall of the opening.

6. The method of claim 4, wherein the photolithography process includes an anisotropic (directional) etch when the lower electrodes are formed on at least one inclined sidewall of the opening.

7. The method of claim 1, wherein step A includes:
   forming at least one inclined sidewall for the opening.

8. The method of claim 1, wherein the step C includes the steps of:
   depositing a capacitor dielectric on the lower electrodes; and
   depositing a upper electrode on the capacitor dielectric.

9. The method of claim 8, wherein the capacitor dielectric is comprised of one of a high-K dielectric or a ferroelectric material.

10. The method of claim 8, wherein the upper electrode is continuous over a plurality of openings, with each opening having a respective plurality of stacked capacitors formed therein.

11. The method of claim 8, wherein the upper electrode is continuous over a column of stacked capacitors formed through a plurality of openings.

12. The method of claim 8, further comprising:
    depositing an upper insulating layer over the upper electrode; and
    forming an interconnect plug through the upper insulating layer within the opening and to be coupled to the upper electrode.

13. The method of claim 8, further comprising:
    depositing an upper insulating layer over the upper electrode; and
    forming an interconnect plug through the upper insulating layer outside of the opening over a mold layer and to be coupled to the upper electrode.

14. The method of claim 8, further comprising:
    forming the opening through a capping layer and a molding layer; and
    planarizing down to the capping layer after step C such that the lower electrodes, the capacitor dielectric, and the upper electrode are contained within the opening.

15. The method of claim 8, further comprising:
forming the opening through a capping layer and a molding layer; and
forming the lower electrodes, the capacitor dielectric, and the upper electrode over a portion of the capping layer.

16. The method of claim 1, wherein the opening has a square shape, and wherein each lower electrode is formed at a respective corner of the opening.

17. The method of claim 1, wherein the opening has a groove shape, and wherein the lower electrodes are formed along sides of the opening.

18. The method of claim 1, wherein the stacked capacitors are part of a DRAM (dynamic random access memory) device or a ferroelectric memory device.

19. A method of forming a plurality of stacked capacitors, comprising:
A. forming an opening through at least one insulating material;
B. patterning a lower electrode material to form a plurality of lower electrodes within the same one opening;
C. forming the plurality of stacked capacitors with the plurality of lower electrodes within the same one opening; and
D. filling the opening with a buffer insulating layer.

20. The method of claim 19, wherein each of the lower electrodes includes a respective support part disposed over a respective conductive plug, and includes a wall part disposed along a respective portion of at least one wall of the opening.

21. The method of claim 19, wherein step B includes:
depositing conformally the lower electrode material on at least one wall of the opening; and
patterning the lower electrode material in a photolithography process for forming the lower electrodes.

22. The method of claim 21, wherein the photolithography process includes an isotropic (non-directional) etch when the lower electrodes are formed on at least one non-inclined sidewall of the opening.

23. The method of claim 21, wherein the photolithography process includes an anisotropic (directional) etch when the lower electrodes are formed on at least one inclined sidewall of the opening.

24. The method of claim 19, wherein the step C includes the steps of:
depositing a capacitor dielectric on the lower electrodes; and
depositing a upper electrode on the capacitor dielectric.

25. The method of claim 24, wherein the capacitor dielectric is comprised of one of a high-K dielectric or a ferroelectric material.

26. The method of claim 24, wherein the upper electrode is continuous over a plurality of openings, with each opening having a respective plurality of stacked capacitors formed therein.

27. The method of claim 24, wherein the upper electrode is continuous over a column of stacked capacitors formed through a plurality of openings.

28. The method of claim 19, wherein the stacked capacitors are part of a DRAM (dynamic random access memory) device or a ferroelectric memory device.

29. A method of forming a plurality of stacked capacitors, comprising:
A. forming an opening through at least one insulating material;
B. patterning a lower electrode material to form a plurality of lower electrodes within the same one opening;
C. forming the plurality of stacked capacitors with the plurality of lower electrodes within the same one opening; and
D. filling the opening with an upper electrode.

30. The method of claim 29, wherein each of the lower electrodes includes a respective support part disposed over a respective conductive plug, and includes a wall part disposed along a respective portion of at least one wall of the opening.

31. The method of claim 29, wherein step B includes:
depositing conformally the lower electrode material on at least one wall of the opening; and
patterning the lower electrode material in a photolithography process for forming the lower electrodes.

32. The method of claim 31, wherein the photolithography process includes an isotropic (non-directional) etch when the lower electrodes are formed on at least one non-inclined sidewall of the opening.

33. The method of claim 31, wherein the photolithography process includes an anisotropic (directional) etch when the lower electrodes are formed on at least one inclined sidewall of the opening.

34. The method of claim 29, wherein the step C includes the steps of:
depositing a capacitor dielectric on the lower electrodes; and
depositing a upper electrode on the capacitor dielectric.

35. The method of claim 34, wherein the capacitor dielectric is comprised of one of a high-K dielectric or a ferroelectric material.

36. The method of claim 34, wherein the upper electrode is continuous over a plurality of openings, with each opening having a respective plurality of stacked capacitors formed therein.

37. The method of claim 34, wherein the upper electrode is continuous over a column of stacked capacitors formed through a plurality of openings.

* * * * *